United States Patent [19]
Oda et al.

[11] Patent Number: 5,962,880
[45] Date of Patent: Oct. 5, 1999

[54] HETEROJUNCTION BIPOLAR TRANSISTOR

[75] Inventors: Katsuya Oda, Hachioji; Eiji Ohue, Kokubunji; Takahiro Onai, Ome; Katsuyoshi Washio, Tokorozawa, all of Japan

[73] Assignee: Hitachi, Ltd., Tokyo, Japan

[21] Appl. No.: 08/892,673

[22] Filed: Jul. 14, 1997

[30] Foreign Application Priority Data

Jul. 12, 1996 [JP] Japan ................................. 8-183274

[51] Int. Cl.⁶ ................................................. H01L 29/737
[52] U.S. Cl. ....................... 257/198; 257/197; 250/214 A
[58] Field of Search ......................... 250/214 A; 257/198

[56] References Cited

U.S. PATENT DOCUMENTS

| | | | |
|---|---|---|---|
| 4,451,916 | 5/1984 | Casper | 359/110 |
| 5,087,892 | 2/1992 | Hayashi | 250/214 A |
| 5,302,841 | 4/1994 | Yamazaki . | |
| 5,323,032 | 6/1994 | Sato et al. . | |
| 5,440,152 | 8/1995 | Yamazaki . | |
| 5,494,836 | 2/1996 | Imai . | |
| 5,508,537 | 4/1996 | Imai | 257/198 |

FOREIGN PATENT DOCUMENTS

| | | |
|---|---|---|
| 0701287A2 | 9/1995 | European Pat. Off. . |
| 1-296664 | 11/1989 | Japan . |
| 3-44937 | 2/1991 | Japan . |
| 3-125476 | 5/1991 | Japan . |
| 5-206151 | 8/1993 | Japan . |
| 7-147287 | 6/1995 | Japan . |

OTHER PUBLICATIONS

Rosenfeld et al., "The Composition Dependence of the Cut–Off Frequencies of Ungraded $Si_{1-x}Ge_x/Si_{1-y}Ge_y/Si_{1-x}Ge_x$ HBTs", Solid State Electronics, vol. 38, No. 3, Mar. 1, 1995.

"Heterojunction Bipolar Transistor Using Si Alloyed with Ge for Greater Base Band Gap Reduction", IBM Technical Disclosure Bulletin, vol. 33, No. 5, Oct. 1990.

"Selective Epitaxial Growth of $Si_{1-x}Ge_x$ Base by UHV–CVD" by M. Hirol et al., Microelectronics Research Labs, NEC Corp. pp. 19–24.

*Primary Examiner*—Jerome Jackson, Jr.
*Attorney, Agent, or Firm*—Antonelli, Terry, Stout & Kraus, LLP

[57] ABSTRACT

A self-aligned bipolar transistor which has a small base resistance and small emitter-base and collector-base capacitances and is operable at high speed is disclosed. This bipolar transistor is characterized in that a low concentration collector region made of single crystal Si—Ge is self-alignedly formed between an intrinsic base of single crystal Si—Ge and an intrinsic base, and that an extrinsic base electrode and an intrinsic base are connected only through a doped external base. With this arrangement, an energy barrier is not established at the collector base interface owing to the formation of the low concentration region of single crystal Si—Ge, so that the transit time of the carriers charged from the emitter is shortened. The connection between the intrinsic base and the extrinsic base electrode via the doped external base results in the reduction of the base resistance. In addition, the self-aligned formation of the emitter-base-collector leads to the reduction in capacitance between the emitter and the base and also between the collector and the base. Accordingly, a high-speed bipolar transistor can be realized and thus, circuits using the transistor are operable at high speed.

18 Claims, 20 Drawing Sheets

HETEROJUNCTION BIPOLAR TRANSISTOR

BACKGROUND OF THE INVENTION

This invention relates to a bipolar transistor and also to a method of fabricating the same. More particularly, the invention relates to a bipolar transistor and its fabrication method wherein single crystal silicon germanium is used as an intrinsic base layer.

A conventional bipolar transistor of the type wherein single crystal silicon germanium is used as an intrinsic base layer is described, for example, in Technical Report of the Institute of Electronics, Information and Communication Engineers SDM91-124, pp. 19 to 24, 1991. The structure in section of the prior art bipolar transistor is shown in FIG. 2.

With reference to FIG. 2, a method of fabricating the prior art bipolar transistor is briefly illustrated. In FIG. 2, reference numeral 21 indicates a silicon substrate. After epitaxial growth of a low concentration n-type silicon layer 23, serving as a collector layer, on a high concentration n-type buried layer 22 formed in the silicon substrate 21, a device isolation layer 24 is formed by selective oxidation.

Subsequently, a base-collector isolation layer 25, an extrinsic base electrode 26 made of polysilicon, and an emitter-base isolation layer 27 are formed on the low concentration n-type silicon layer 23. The emitter-base isolation layer 27 and the extrinsic base electrode 26 are, respectively, etched to form an opening.

After coverage of the side walls of the extrinsic base electrode 26 with an insulating layer 27a, single crystal silicon germanium is epitaxially grown to form an intrinsic base layer 28. Simultaneously with the epitaxial growth of the single crystal silicon germanium, an extrinsic base 29 made of polysilicon is deposited from the bottom surface of the overhang of the base electrode 26, so that when the growth is continued, the intrinsic base layer 28 and the extrinsic base electrode 26 are connected through an extrinsic base 29.

To prevent the conduction between the extrinsic base 29 and an emitter, an emitter-base isolation layer 30 is formed. An n-type polysilicon 31 in which arsenic is doped at a high concentration is deposited in the opening, followed by annealing to cause the arsenic to be diffused into the intrinsic base layer 28, thereby forming an emitter layer 32. After formation of an insulating layer 33, an electrode 35 is formed. It will be noted that reference numeral 34 indicates a high concentration n-type collector electrode layer.

The profiles of germanium and the impurities in the known bipolar transistor wherein single crystal silicon germanium is used as an intrinsic base layer are, respectively, shown in FIGS. 3A and 3B. FIG. 3A is a compositional profile of germanium, and FIG. 3B is a concentration profile of the respective impurities. In the figures, $J_{EB}$ and $J_{BC}$ shown by the broken lines, respectively, indicate an interface of emitter-base junction and an interface of base-collector junction.

As will be appreciated from FIG. 3A, because doping is carried out during the course of the growth of the single crystal silicon germanium, the intrinsic base layer made of single crystal silicon germanium is formed directly on the collector region made of single crystal silicon. The energy band structure of the bipolar transistor having this profile is shown in FIG. 4. The energy barrier ascribed to the difference in band gap between the single crystal silicon and the single crystal silicon germanium is created at the base-collector interface, $J_{BC}$, with the attendant problem that the transit time of the carriers charged from the emitter becomes long.

Japanese Laid-open Patent Application No. 3-125476 proposes a heterobipolar transistor structure wherein both a base layer and a low impurity concentration collector layer are formed of a mixed crystal of silicon germanium in order to prevent an energy barrier against a collector current to be developed between the base layer and the low impurity concentration collector layer. If this is applied to the above-stated type of bipolar transistor structure where the base electrode is self-alignedly established, e.g. if a single crystal silicon germanium layer is formed between the intrinsic base layer 28 and the low concentration collector layer 23 in a self-aligned manner, as shown in FIG. 2, polysilicon germanium of low concentration is undesirably deposited beneath the extrinsic base electrode 26 made of polysilicon. In this way, an extrinsic base having a high resistance is formed between the extrinsic base electrode 26 and the intrinsic base layer 28. This, in turn, presents the problem that the base resistance increases and, thus, the circuit operation becomes slow.

Moreover, an n-type impurity from the high concentration polysilicon 31 serving as an emitter electrode is diffused into the single crystal silicon germanium layer 28 which has been formed while doping, so that the concentration of the impurity at the emitter-base junction becomes high as is particularly shown in FIG. 3B. This leads to the problem that a tunnel effect takes place at the emitter-base interface and the leakage current in the base region increases.

Japanese Laid-open Patent Application No. 7-147287 discloses a bipolar transistor wherein the formation of a parasitic energy barrier in a base-collector junction region is prevented and thus, the frequency cutoff is suppressed from lowering. To this end, the bipolar transistor is so arranged that a base layer and a collector layer are, respectively, made of single crystal silicon containing germanium. Ge is between the diffused layer of the extrinsic base region and the collector becomes greater than with the case where the base electrode is self-alignedly taken out via the polysilicon layer directly connected with the intrinsic base layer as shown in FIG. 2.

SUMMARY OF THE INVENTION

It is accordingly an object of the invention to provide a bipolar transistor of the type using a single crystal silicon germanium layer as an intrinsic layer, wherein in order to enable high-speed operations, the bipolar transistor is designed to have no energy barrier at the collector base interface, to have a small base resistance, and to have small capacitances between the emitter and the base and also between the collector and the base. It is another object of the invention to provide a method of fabricating a bipolar transistor of the type mentioned above.

The bipolar transistor according to the invention is characterized by comprising, at least: a multilayered film which includes a single crystal silicon layer of a first conduction type, e.g. a low concentration n-type collector layer 3 serving as a first collector region in FIG. 1, a first insulating layer (i.e. a collector base isolation layer 5) formed on the surface of the single crystal silicon layer of the first conduction type and having an opening therein, a polycrystalline layer of a second conduction type distributed in the base layer such that its concentration is lower at the side of the emitter layer and is higher at the side of the collector layer. Likewise, Ge is distributed in the collector layer such that its concentration is higher at the side of the base layer and is lower at the side of an n-type high concentration buried layer in the inside of the collector layer. In addition, the concentration of Ge in the collector layer abruptly decreases at the side of the base layer and gently decreases at the side of the buried layer. The problem on the energy barrier could be avoided by application of this base-collector structure to the self-aligned extrinsic base electrode structure shown in FIG. 2. However, as stated before, since the low concentration polysilicon germanium is deposited beneath the extrinsic base electrode 26, there is still left the problem that the base resistance increases, causing the circuit operations to be delayed.

Japanese Laid-open Patent Application No. 5-206151 discloses a bipolar transistor wherein an emitter region is self-alignedly formed relative to an extrinsic base region and polysilicon for a base electrode. An intrinsic base layer made of a single crystal silicon germanium layer and polysilicon for p+ base electrode are connected with each other via an extrinsic base region formed by the diffusion of an impurity from the polysilicon for p+ base electrode. This structure is disadvantageous in that the capacitance of the junction opposite to the first conduction type (i.e. an extrinsic base electrode 6 made of a p-type polysilicon), and a second insulating layer (i.e. an emitter-base isolation layer 7); a single crystal silicon germanium layer of the first conduction type (i.e. a low concentration n-type collector layer 8 made of single crystal silicon germanium) formed in the opening; a single crystal silicon germanium layer of the second conduction type (i.e. a p-type intrinsic base layer 9 made of single crystal silicon germanium) formed on the single crystal silicon germanium layer of the first conduction type; and a polysilicon germanium layer of the second conduction type (i.e. a p-type extrinsic base layer 10 made of polysilicon germanium layer) formed in contact with both the single crystal silicon germanium layer of the second conduction type and the polycrystalline layer of the second conduction type.

More particularly, the bipolar transistor of the invention includes a silicon substrate, and the second collector layer made of single crystal silicon germanium of low concentration and formed in the opening of the first insulting layer formed in the first collector region of the substrate. The bipolar transistor has such a structure that the extrinsic base electrode made of polysilicon and the intrinsic base region formed on the second collector layer and made of single crystal silicon germanium doped with an impurity are contacted via an external base made of polysilicon germanium doped with an impurity. In this way, since the second collector layer made of single crystal silicon germanium is formed between the first collector layer and the intrinsic base made of single crystal silicon germanium, any energy barrier is not established between the collector and the base. This leads to the shortage in transit time of the carriers charged from the emitter. In addition, the intrinsic base and the extrinsic base electrode are connected only through the doped external base of low resistance, resulting in the reduction of a base resistance. The emitter, base and collector are self-alignedly formed, so that the capacitances between the emitter and the base and also between the collector and the base can be reduced, respectively. This means that the bipolar transistor of the invention is enabled to operate at high speed.

In the bipolar transistor, the polycrystalline layer of the second conduction type should preferably consist of a polysilicon layer or a polysilicon germanium layer.

The single crystal silicon germanium layer of the first conduction type, i.e. the thickness of the lower concentration n-type collector layer 8 serving as the second collector layer in FIG. 1, should preferably be at least 5 nm.

It is also preferred to further form, on the single crystal silicon germanium layer of the second conduction type, a second single crystal layer of the second conduction type with an impurity concentration lower than that of the single crystal silicon germanium layer of the second conduction type. More particularly, as shown in FIG. 1, a single crystal cap layer 11 of low concentration is preferably formed in association with the structure wherein the intrinsic region 9 and the extrinsic base electrode 6 are connected via the doped external base 10.

In this case, the second single crystal layer of the second conduction type should preferably consist of a single crystal silicon layer or a single crystal silicon germanium layer.

Preferably, a second single crystal layer of the first conduction type is formed on the single crystal silicon germanium layer of the second conduction type. More particularly, it is preferred to form, on the intrinsic base, a single crystal layer serving as an emitter layer formed by epitaxial growth.

The second single crystal layer of the first conduction type should preferably consist of a single crystal silicon layer or a single crystal silicon germanium layer.

In any types of bipolar transistors set out above, the compositional ratio of germanium in the single crystal silicon germanium layer of the second conduction type should preferably have such a profile as to decrease from the side of the single crystal silicon layer of the first conduction toward the surface. This is particularly shown in FIG. 15A wherein the content of germanium in the base layer has a profile of decreasing from the collector side toward the emitter side.

Alternatively, the compositional profile of germanium in both the single crystal silicon germanium layer of the second conduction type and the single crystal silicon germanium layer of the first conduction type may be such that its content decreases from the side of the single crystal silicon layer of the first conduction type toward the surface. More particularly, as shown in FIG. 17A, the composition of germanium in the layers including the low concentration collector layer should have a profile of decreasing from the collector side toward the emitter side.

Still alternatively, the compositional profiles of germanium in the single crystal silicon germanium layer of the second conduction type and the single crystal silicon germanium layer of the first conduction type may be such that they, respectively, decrease from the side of the single crystal silicon layer of the first conduction type toward the surface, with their gradients in the single crystal silicon germanium layer of the second conduction type and the single crystal silicon germanium layer of the first conduction type differing from each other. More particularly, as shown in FIG. 19A, the gradients of the compositional profiles of germanium in the intrinsic base layer and the low concentration n-type collector may be different from each other.

Yet still alternatively, the compositional profile of germanium in the single crystal silicon germanium layer of the second conduction type may decrease from the side of the single crystal silicon layer of the first conduction type toward the surface, and the compositional profile of germanium in the single crystal silicon germanium layer of the first conduction type may decrease from the surface toward the side of the single crystal silicon layer of the first conduction type. As shown in FIG. 21A, these profiles are such that the content of germanium in the intrinsic base decreases from the side of the collector toward the side of the emitter, and the content of germanium in the low concentration n-type collector layer decreases from the side of the base toward to the side of the collector.

The method of fabricating a bipolar transistor according to the invention comprises, at least, the steps of forming a multi-layered film including a first insulating layer formed on the surface of a single crystal silicon layer of a first conduction type and having an opening therein, a polycrystalline layer of a second conduction type opposite to the first conduction type, and a second insulating layer, forming a single crystal silicon germanium layer of the first conduction type in the opening, and forming a single crystal silicon germanium layer of the second conduction type on the single crystal silicon germanium layer of the first conduction type and simultaneously forming a polysilicon germanium layer of the second conduction type which is in contact with both the single crystal silicon germanium layer of the second conduction type and the polycrystalline layer of the second conduction type.

In this fabrication method, the step of forming the single crystal silicon germanium layer of the first conduction type and the step of forming the single crystal silicon germanium layer of the second conduction type are those steps of the formation through epitaxial growth and are characterized in that the epitaxial growth is carried out under conditions of a growth temperature of 500° C. to 700° C. and a growth pressure lower than 100 Pa.

In short, the method of fabricating a bipolar transistor according to the invention includes the epitaxial growth of the single crystal silicon germanium for the second low concentration collector, the intrinsic base layer and the low concentration cap layer of the bipolar transistor under conditions of a temperature of from 500° C. to 700° C. and a pressure lower than 100 Pa. When the epitaxial growth is performed under such conditions as mentioned above, it becomes possible not to have polysilicon germanium deposited on the polysilicon depending on the content of germanium and the grown layer thickness when the single crystal silicon germanium layer is grown on the single crystal silicon. In this way, when the second low concentration collector layer is formed, it is suppressed that a low concentration polysilicon germanium is grown from the bottom surface of the overhang of the extrinsic base electrode made of a polycrystalline layer. On the other hand, when using the above-indicated growth conditions at the time of forming the high concentration intrinsic base, a high concentration polycrystalline layer grows from the bottom surface of the overhang of the extrinsic base electrode to form an external base layer. In this condition, when the total in thickness of the intrinsic base and the external base becomes equal to a difference in the thickness between the collector base isolation layer and the second low concentration collector layer, the intrinsic base and the extrinsic base electrode can be brought into contact with the external base.

An optical reception system of the invention comprises a photo detector for receiving an optical signal and outputting an electric signal, a first amplifier circuit for receiving the electric signal from the photo detector, a second amplifier circuit for receiving an output from the first amplifier circuit, and a decision circuit for converting the output of the second amplifier to a digital signal in synchronism with a given clock signal. In this optical reception system, the first amplifier circuit is characterized by comprising a first bipolar transistor whose base is connected to the photo detector, and a second bipolar transistor whose base is connected to a collector of the first bipolar transistor and whose collector is connected to the input of the second amplifier circuit, wherein at least one of the first and second bipolar transistors is any one of the bipolar transistors of the invention defined hereinbefore.

It is preferred that the first and second bipolar transistors are formed on a single semiconductor chip, and the semiconductor chip and the photo detector are mounted on a single board.

These above and further objects and features of the invention will be seen by reference to the description, taken in connection with the accompanying drawings.

DESCRIPTION OF THE PREFERRED EMBODIMENTS

The bipolar transistors and fabrication thereof according to the embodiments of the invention are described in detail with reference to the accompanying drawings.
Embodiment 1

Figure 1:
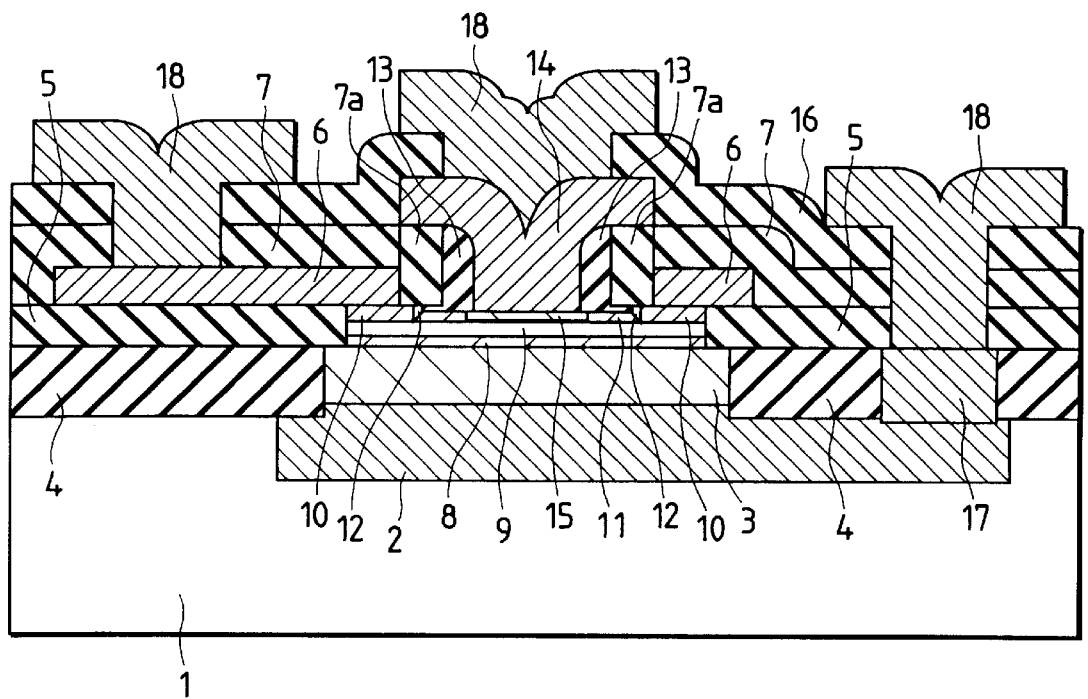
FIG. 1 is a sectional view showing a bipolar transistor according to a first embodiment of the invention.
Figure 2:
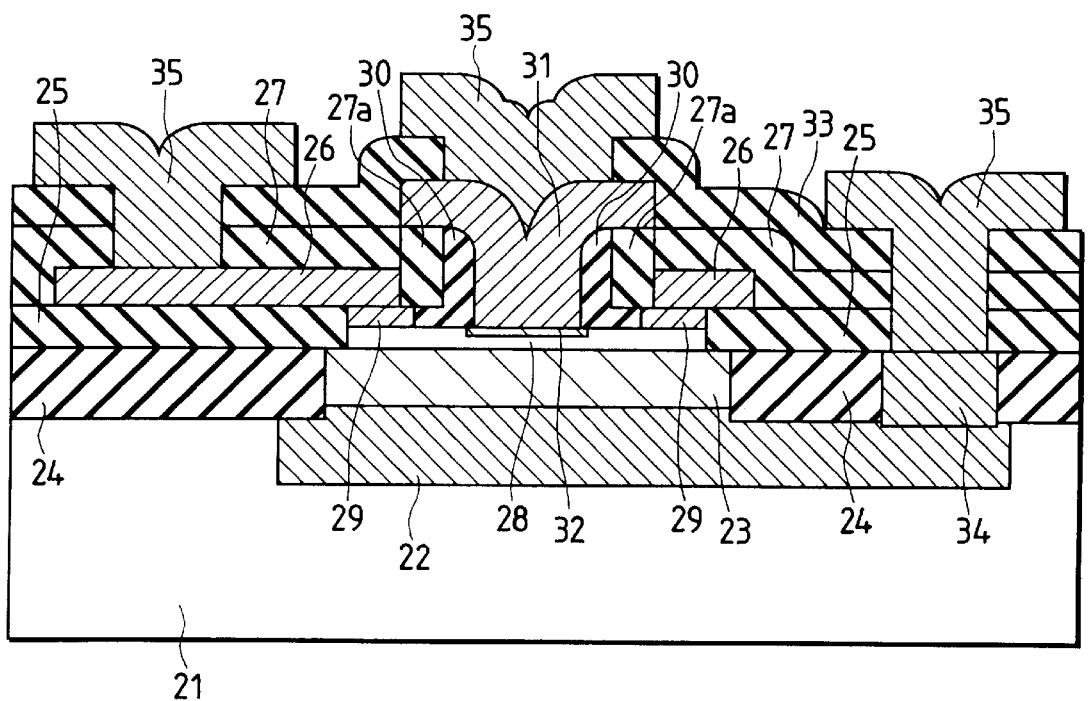
FIG. 2 is a sectional view showing a known bipolar transistor wherein single crystal silicon germanium is used as an intrinsic base.

FIG. 1 is a sectional view of a bipolar transistor according to a first embodiment of the invention. A method for fabricating the bipolar transistor having such a structure as shown in FIG. 1 is described.

A p-type silicon substrate 1 in which a high concentration n-type buried layer 2 is formed in emitter and collector regions is provided. A low concentration n-type collector layer 3 is epitaxially grown over the entire surface of the p-type silicon substrate 1, and device isolation layers 4 are formed on portions except for the emitter region.

Subsequently, a collector base isolation layer 5, at extrinsic base electrode 6 made of polysilicon, an opening of an emitter-base isolation layer 7, and an emitter-base isolation film 7a on side walls of the extrinsic base electrode 6 are formed, respectively, as shown.

The opening is formed with a low concentration n-type collector layer 8 made of single crystal silicon germanium, a p-type intrinsic base layer 9 made of single crystal silicon germanium, a p-type extrinsic base layer 10 made of polysilicon germanium, a low concentration p-type cap layer 11 made of single crystal silicon, and a low concentration p-type polysilicon layer 12.

After coverage of the extrinsic base with an emitter-base isolation layer 13, an emitter electrode 14 made of high concentration n-type polysilicon is deposited, followed by annealing to form an emitter region 15 within the low concentration cap layer 11.

After deposition of an insulating layer 16, an opening is formed correspondingly to a collector portion of the insulating layers 5, 7 and 16, and a high concentration extrinsic n-type collector layer 17 is formed in the opening. Thereafter, openings corresponding to emitter and base portions are formed in the insulating layers 5, 7 and 16 by etching through a resist mask. Finally, an electrode 18 is formed in the respective openings for the emitter, base and collector as shown.

In the above bipolar transistor, the extrinsic base electrode 6 may be made of polysilicon germanium and the low concentration cap layer 11 may be made of single crystal silicon germanium. In place of the low concentration polysilicon layer 12, a low concentration silicon germanium layer may be used. In embodiments appearing hereinafter, these layers may be likewise used.

Figure 6:
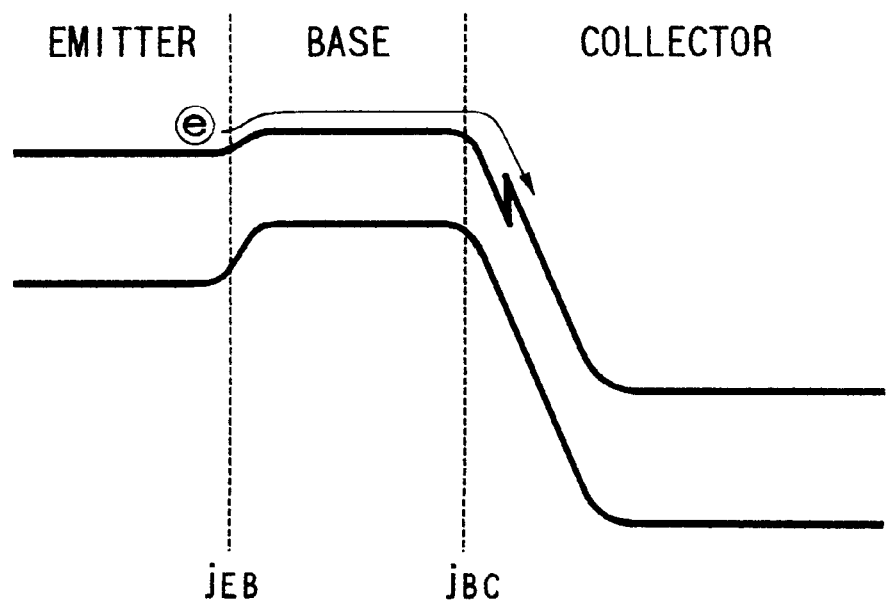
FIG. 6 is a schematic view showing an energy band structure of the bipolar transistor of the invention having such profiles as shown in FIGS. 5A and 5B.
Figure 5A:
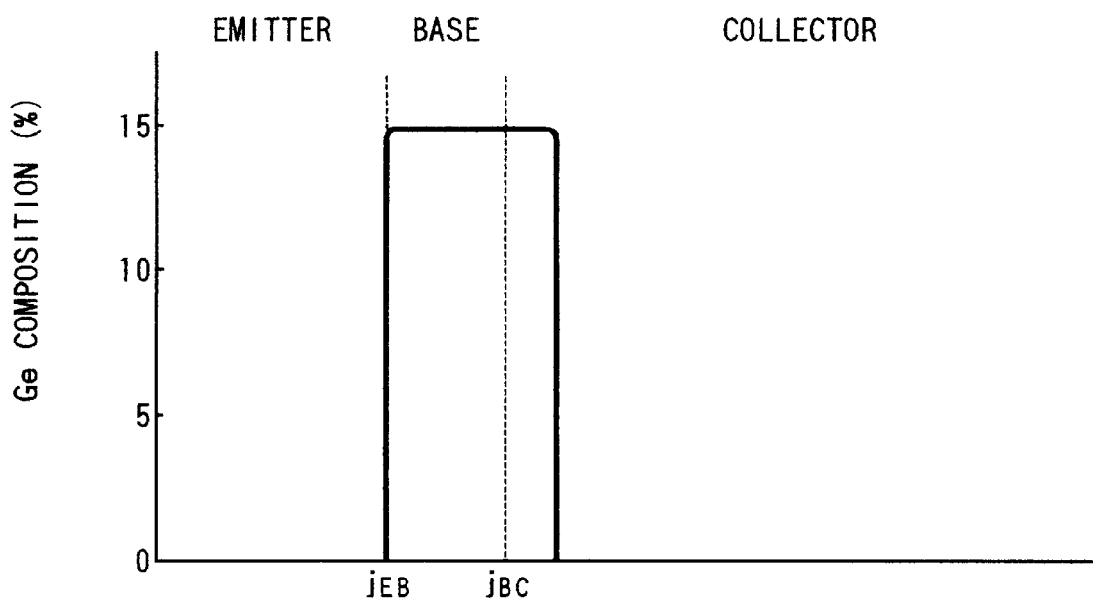
FIG. 5A is a characteristic graph showing a compositional ratio of Ge in the bipolar transistor of the invention shown in FIG. 1.
Figure 5B:
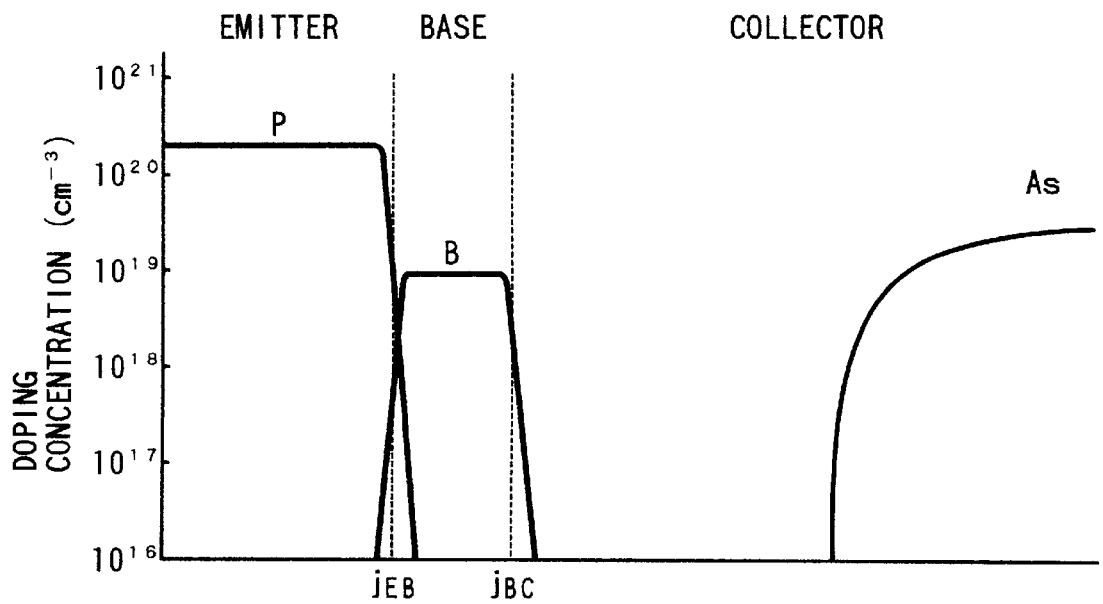
FIG. 5B is a characteristic graph showing concentration profiles of impurities in the bipolar transistor of the invention shown in FIG. 1.
Figure 7A:
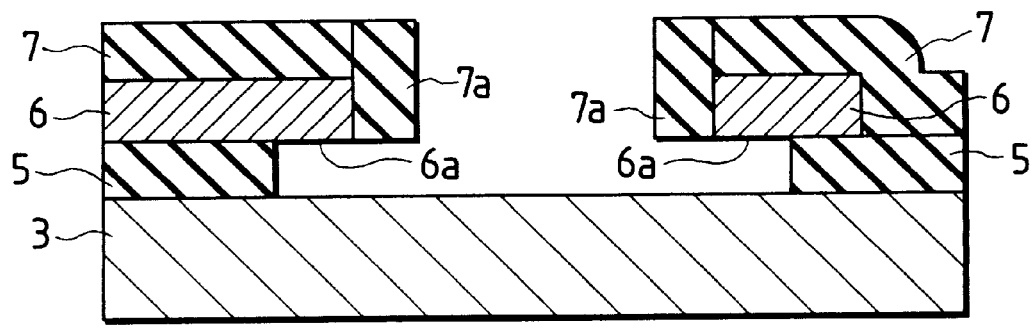
FIGS. 7A to 7C are, respectively, partially enlarged sectional views showing the steps of a method for fabricating active regions of the bipolar transistor of the invention shown in FIG. 1.
Figure 7B:
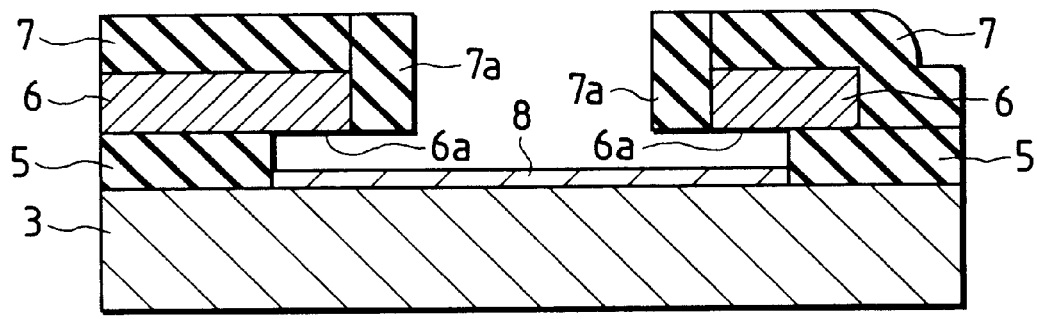
Figure 7C:
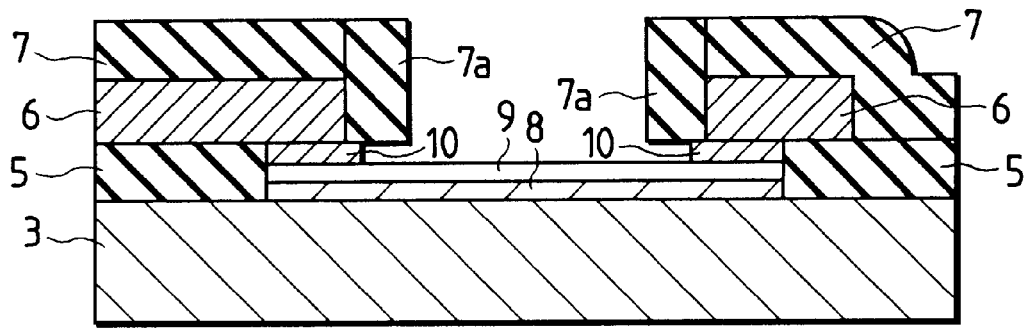

The compositional ratio of germanium and concentration profiles of impurities in the bipolar transistor of this embodiment are, respectively, shown in FIGS. 5A and 5B and the energy band structure is shown in FIG. 6. As will be seen from FIG. 5A, germanium is present not only in the base layer, but also in the collector region. As a result, as shown in FIG. 6, the energy barrier ascribed to the different in the band gap between the silicon and the silicon germanium is contained in the depletion layer between the collector and the base, so that the carriers charged from the emitter is accelerated by the action of an electric field. In this manner, the charged carriers can arrive at the collector without any influence of the barrier.

Figure 3A:
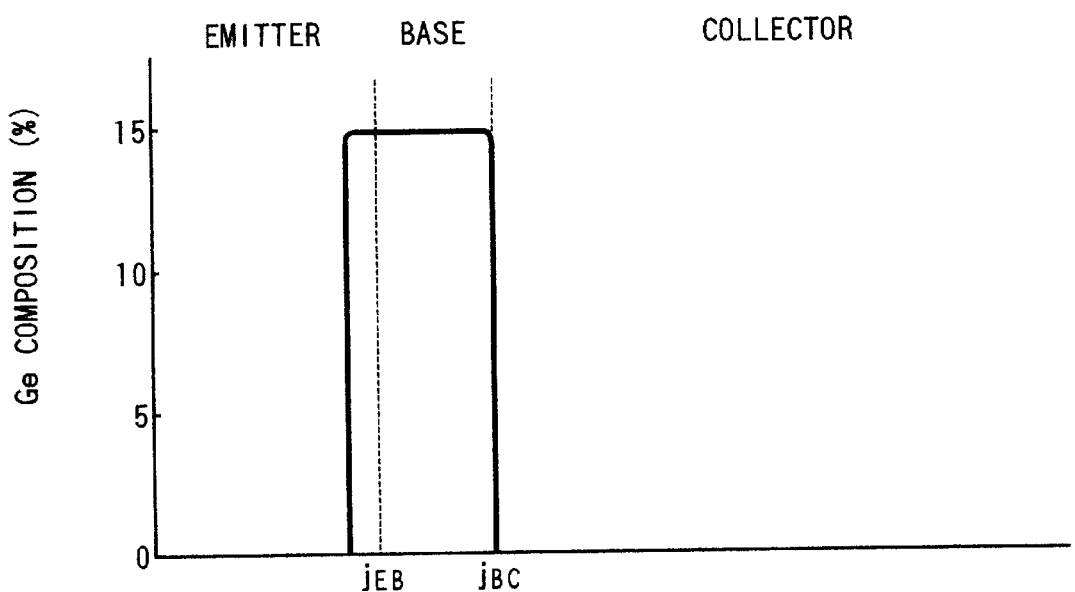
FIG. 3A is a characteristic graph showing the compositional ratio of Ge in the bipolar transistor shown in FIG. 2.
Figure 3B:
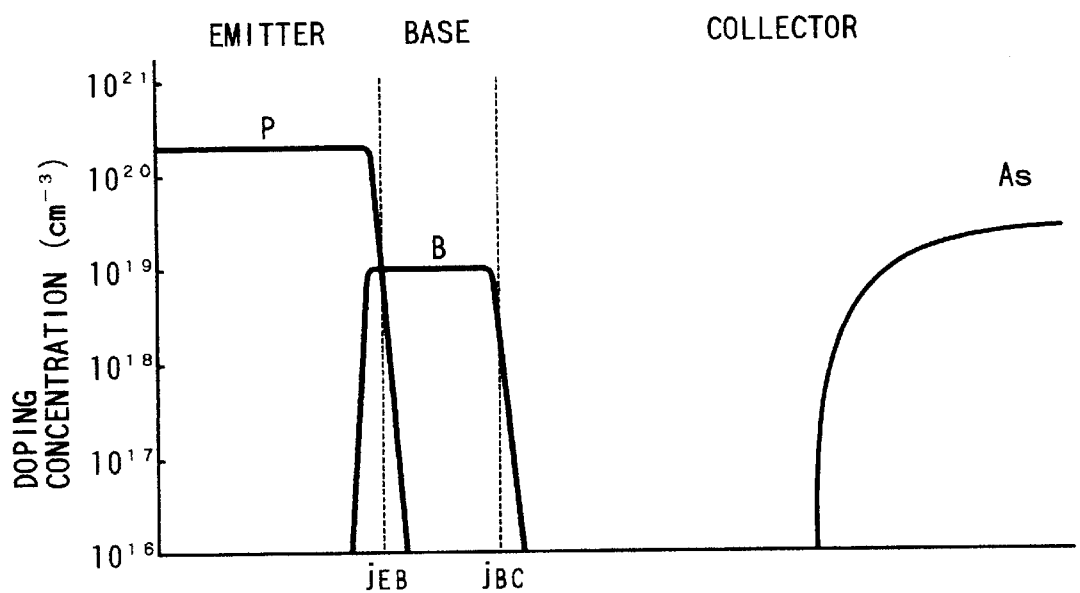
FIG. 3B is a characteristic graph showing concentration profiles of impurities in the bipolar transistor shown in FIG. 2.
Figure 4:
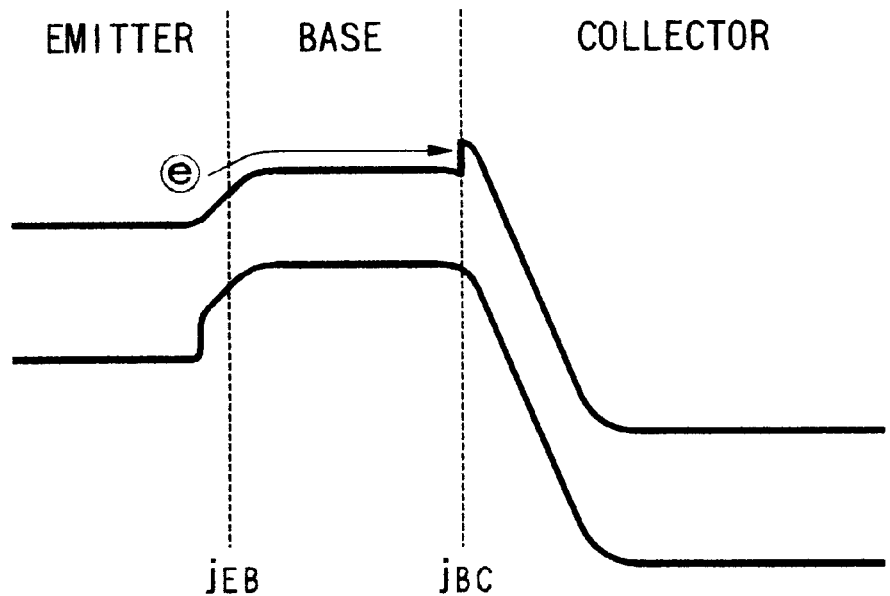
FIG. 4 is a schematic view showing an energy band structure of the known bipolar transistor having such profiles as shown in FIGS. 3A and 3B.

As shown in FIG. 5B, the low concentration cap layer 11 is formed on the intrinsic base 9, for which the impurity concentration at the emitter base junction is lower than that of the conventional counterpart shown in FIG. 3B. This results in the reduction in tunnel current in the emitter base junction. It will be noted that in FIG. 5B, the impurity concentration in the emitter region is for phosphorus (P), the impurity concentration in the base region is for boron (B), and the collector region includes two low concentration n-type layers 8 and 3 whose impurity concentration are, respectively, as low as $10^{16}$ cm$^{-3}$ or below, so that only an impurity profile of the high concentration n-type buried layer 2 using arsenic (As) as an impurity is shown.

FIGS. 7A to 8B show a flowchart showing a method for making active regions which are essential parts of the bipolar transistor of this embodiment.

The low concentration n-type collector layer 3 made of single crystal silicon is formed thereon with the collector base isolation layer 5, the extrinsic base electrode 6 made of polysilicon (or polysilicon germanium) and the emitter-base isolation layer 7, followed by etching to form an opening in the emitter-base isolation film 7 and the extrinsic base electrode 6. The emitter-base isolation film 7a is formed on the side walls of the extrinsic base electrode 6, after which the collector base isolation layer 5 around the opening of the extrinsic base electrode 6 is etched to form an overhang 6a of the extrinsic base electrode 6 (see FIG. 7A).

Thereafter, in order to avoid formation of any energy barrier at the base-collector interface, the second low concentration collector layer 8 made of single crystal silicon germanium is formed by epitaxial growth on the low concentration n-type collector layer 3. At that time, while the difference between the commencing time of growth of single crystal silicon germanium on the single crystal silicon and the commencing time of growth of polysilicon germanium on the polysilicon is utilized, the epitaxial growth is performed under conditions of not permitting the polysilicon germanium to be deposited on the bottom of the overhang 6a of the extrinsic base electrode 6.

Figure 9:
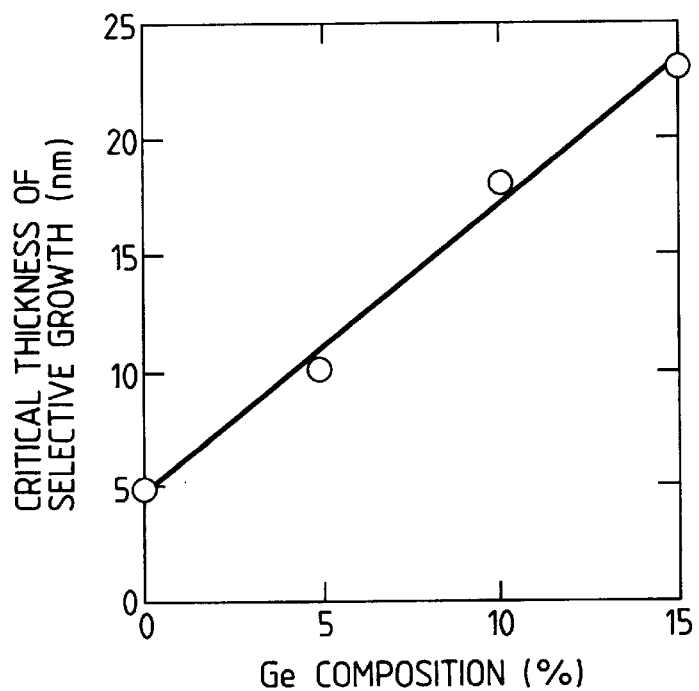
FIG. 9 is a characteristic graph showing the relation between the critical thickness of a single crystal silicon germanium layer formed by selective growth on single crystal silicon relative to polysilicon and the compositional ratio of germanium.

For instance, where an epitaxial growth temperature is set at 575° C. and a growth pressure is set at 1 Pa, the relation between the layer thickness of the single crystal silicon germanium grown on the single crystal silicon, i.e. the critical layer thickness attained by the selective growth, before the polysilicon germanium starts to be deposited on the polysilicon and the compositional ratio of germanium present in the single crystal silicon germanium layer is shown in FIG. 9. FIG. 9 reveals that where the layer consists of silicon alone (compositional ratio of Ge=0%) and the single crystal silicon layer grown on the single crystal silicon has a thickness of 5 nm or below, any polysilicon is not deposited on the polysilicon.

With the silicon germanium layer, as the compositional ratio of germanium increases, the layer thickness increases. At a compositional ratio of 15%, even though an about 20 nm thick single crystal silicon germanium layer is grown on the single crystal silicon, any polysilicon germanium is not deposited on the polysilicon. Accordingly, if a low concentration collector layer having a thickness smaller than the critical thickness is selectively grown, any low concentration polysilicon germanium layer is not deposited on the bottom surface of the overhang 6a of the extrinsic base electrode (see FIG. 7B).

The growth may be carried out using a gas source MBE (Molecular Beam Epitaxy) technique or a CVD (Chemical Vapor Deposition) technique. From the standpoint of the well-controlled selectivity, the CVD method is preferred. The temperature is in the range between not lower than 500° C. at which good selectivities between polysilicon and single crystal silicon and also between an insulating material and single crystal silicon are obtained and not higher than 700° C. at which crystal defects start to develop. The growth pressure conditions may be 100 Pa or below at which a polysilicon germanium layer starts to grow from the bottom surface of the overhang 6a of the extrinsic base electrode within the above-defined temperature range.

When the intrinsic base layer 9 which is made of single crystal silicon germanium doped with an impurity at a high concentration is formed, the total in thickness of the low concentration collector layer 8 and the intrinsic base layer 9 is made larger than the critical layer thickness by the selective growth. In this condition, the polysilicon germanium is deposited from the bottom surface of the overhang 6a of the extrinsic base electrode 6 along with the growth of the single crystal silicon germanium thereby forming the external base 10. At the time when the total thickness of the intrinsic base layer 9 and the external base 10 becomes equal to a difference in thickness between the collector base isolation layer 5 and the low concentration collector layer 8, the intrinsic base layer 9 and the extrinsic base electrode 6 are connected to each other (see FIG. 7C).

Figure 8A:
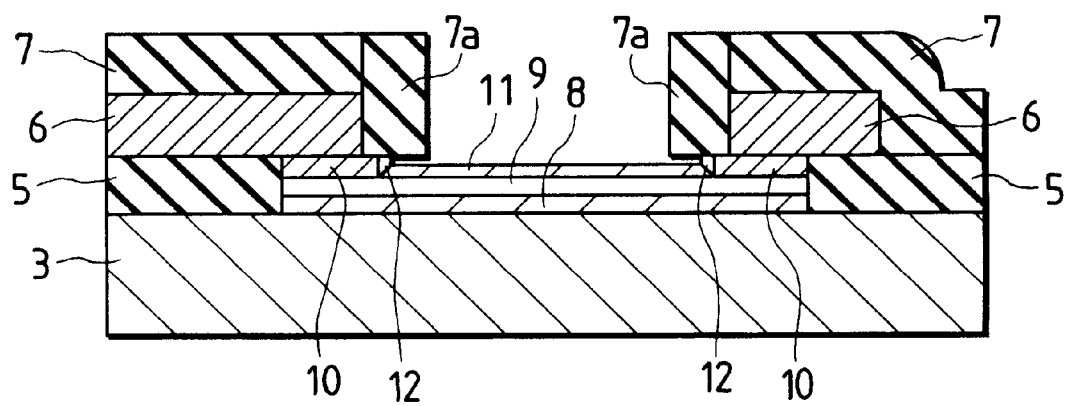
FIGS. 8A and 8B are, respectively, partially enlarged section views showing the steps subsequent to the step of FIG. 7C.

After the connection of the intrinsic base layer 9 with the extrinsic base electrode 6 through the external base 10, the low concentration cap layer 11 made of single crystal silicon (or single crystal silicon germanium) is formed in order to suppress the tunnel current of the emitter-base junction (see FIG. 8A). At the time, the low concentration polysilicon (or low concentration polysilicon germanium) 12 is deposited on side walls of the external base 10 along with the low concentration cap layer. Nevertheless, the base resistance does not increase since the intrinsic base layer 9 and the extrinsic base electrode 6 are connected via the external base 10.

Figure 8B:
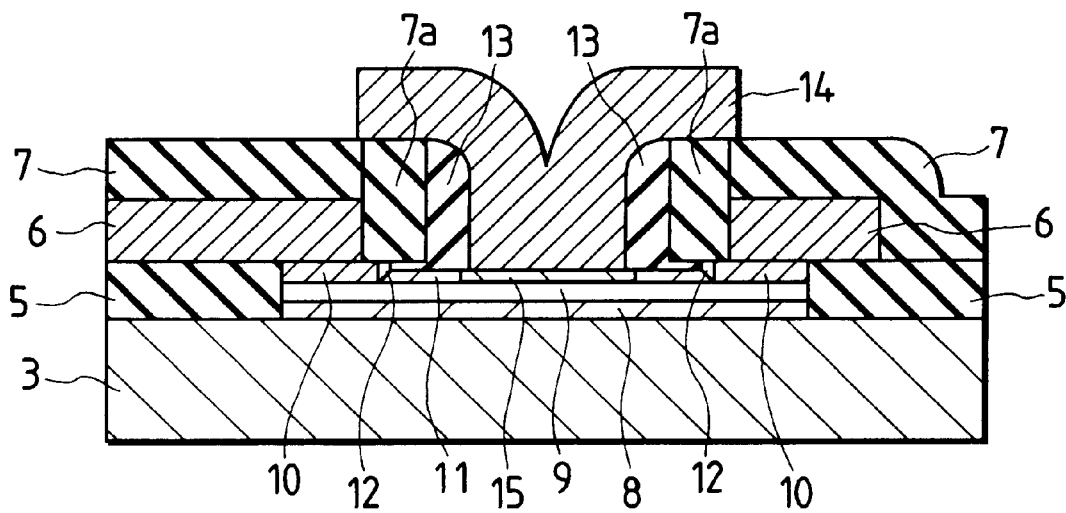

After formation of the second emitter-base isolation layer 13 to cover the external base 10 and the polysilicon (or the polysilicon germanium) 12, the high concentration n-type polysilicon 14 serving as a diffusion source for emitter and also as an emitter electrode is deposited, followed by annealing to cause an n-type impurity to be diffused into the low concentration cap layer 11 thereby forming the emitter region 15 (see FIG. 8B).

Subsequently, the insulating layer 16 is deposited, followed by forming openings corresponding to the emitter, base and collector regions, respectively, and then forming the electrodes 18 in the respective openings to obtain the sectional structure shown in FIG. 1.

In accordance with this embodiment, the influence of the energy barrier developed at the collector base interface owing to the band gap between the silicon and the silicon germanium can be reduced without increasing a base resistance and capacitances at the emitter-base interface and also at the collector base interface. Additionally, because the leakage current in the base region can be reduced, a high-speed bipolar transistor is obtainable wherein cutoff frequency, $F_T$, and maximum frequency, $f_{max}$, are, respectively, 10 GHz or above. The use of this type of transistor enables one to attain high speed and high performance of circuits.

Embodiment 2

Figure 10:
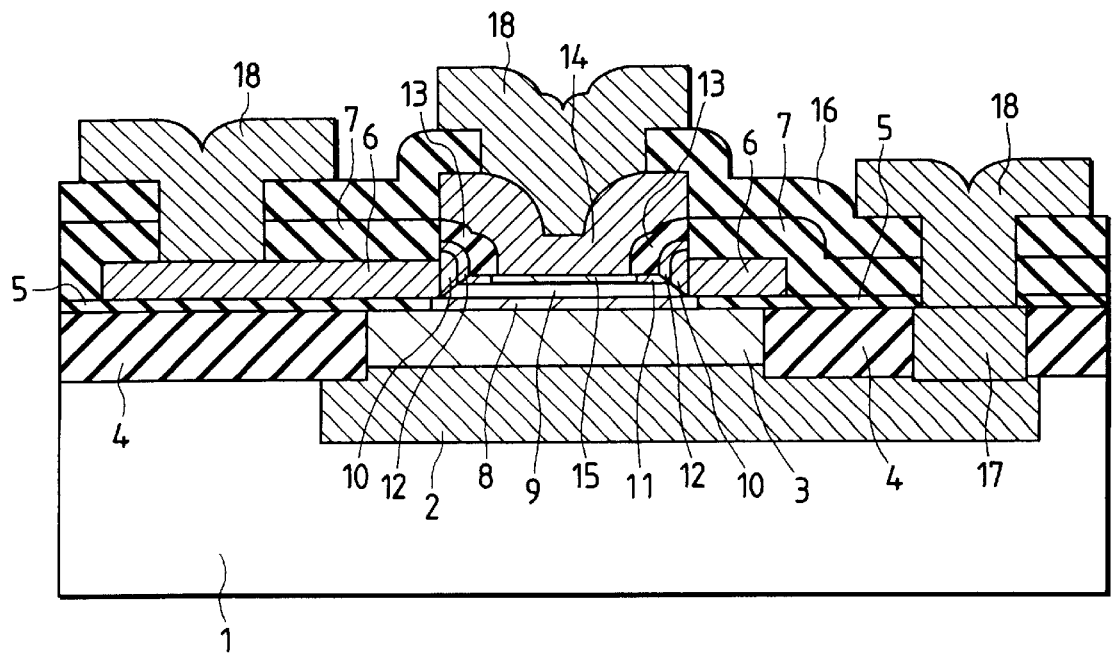
FIG. 10 is a sectional view of a bipolar transistor according to a second embodiment of the invention.

FIG. 10 shows a sectional view showing the structure of a bipolar transistor according to a second embodiment of the invention. The method of fabricating the bipolar transistor having the structure of this embodiment is described below.

Like Embodiment 1, a high concentration n-type buried layer 2, a low concentration n-type collector layer 3, a device isolation layer 4, a collector base isolation layer 5, an extrinsic base electrode 6, and an emitter-base isolation layer 7 are formed on a silicon substrate 1, respectively. Next, the emitter-base isolation layer 7, the extrinsic base electrode 6 and the collector base isolation layer 5 are etched to form an opening, followed by further formation of a low concentration n-type collector layer 8, a p-type intrinsic base layer 9, a p-type external base layer 10, a low concentration cap layer 11, and a low concentration polysilicon (or polysilicon germanium) 12 in the opening as shown.

After coverage of the external base with an emitter-base isolation layer 13, an emitter electrode 14 made of high concentration n-type polysilicon is deposited, followed by annealing to form an emitter region 15 within the low concentration cap layer 11.

Finally, an insulating layer 16 is deposited in the same manner as in Embodiment 1, and an opening is formed at a collector portion of the insulating layers 5, 7 and 16 to form a high concentration n-type extrinsic collector layer 17. Likewise, openings are formed at emitter and base portions of the insulating layers 5, 7 and 16 to form electrodes 18, respectively.

The compositional ratio of germanium and impurity concentration profiles of the bipolar transistor are similar to those shown in FIGS. 5A and 5B illustrated in respect of Embodiment 1, with similar effects being obtained.

The difference from the transistor of Embodiment 1 shown in FIG. 1 resides in that the thickness of the collector base isolation layer 5 is substantially equal to that of the low concentration n-type collector layer 8, so that the degree of etching for making an opening in the collector base isolation layer 5 can be reduced. This unnecessitates the overhang 6a of the extrinsic base electrode, thus leading not only to the reduction in collector base capacitance, but also to the suppressed variation in size of the opening. As a result, the working characteristics of circuitries using this transistor are improved while suppressing a characteristic variation.

Since the degree of etching of the collector base isolation layer 5 is not so great, it becomes possible to check the shape of the external base 10 and the connection between the intrinsic base and the external base as viewed from the above of wafer after formation of the intrinsic base layer 9.

FIGS. 11A to 12B is a flowchart showing a method of fabricating active regions which are essential to the bipolar transistor of this embodiment.

Figure 11A:
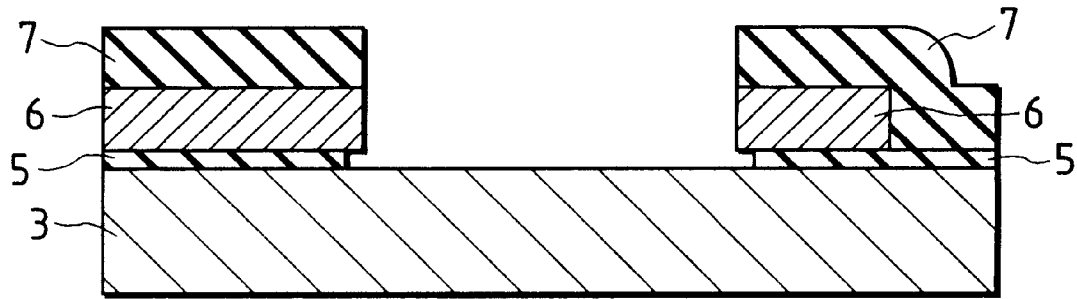
FIGS. 11A to 11C are, respectively, partially enlarged sectional views showing the steps of a method for fabricating active regions of the bipolar transistor of the invention shown in FIG. 10.
Figure 11B:
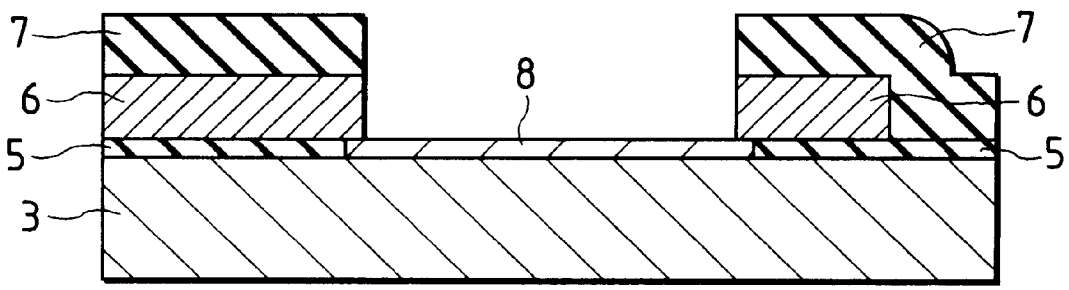
Figure 11C:
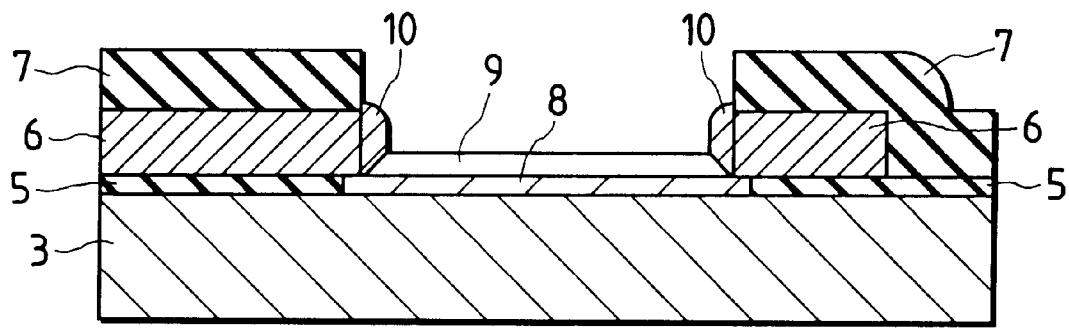

The collector base isolation layer 5, the extrinsic base electrode 6 made of polysilicon (or polysilicon germanium), and the emitter-base isolation layer 7 are formed on the low concentration n-type collector 3 made of single crystal silicon, followed by etching to form an opening (see FIG. 11A).

Next, the second low concentration collector layer 8 made of single crystal germanium is epitaxially grown between the intrinsic layer 9 and the low concentration collector region 3 in order not to establish any energy barrier at the base-collector interface. The epitaxial growth should be performed under conditions where any polysilicon germanium is not deposited on side walls of the extrinsic base electrode 6, like Embodiment 1 (see FIG. 11B).

Subsequently, the intrinsic base layer 9 made of single crystal silicon germanium doped with an impurity at a high concentration is formed and, at the same time, polysilicon germanium is deposited on side walls of the extrinsic base electrode 6 to connect between the intrinsic base layer 9 and the extrinsic base electrode 6 (see FIG. 1C).

Figure 12A:
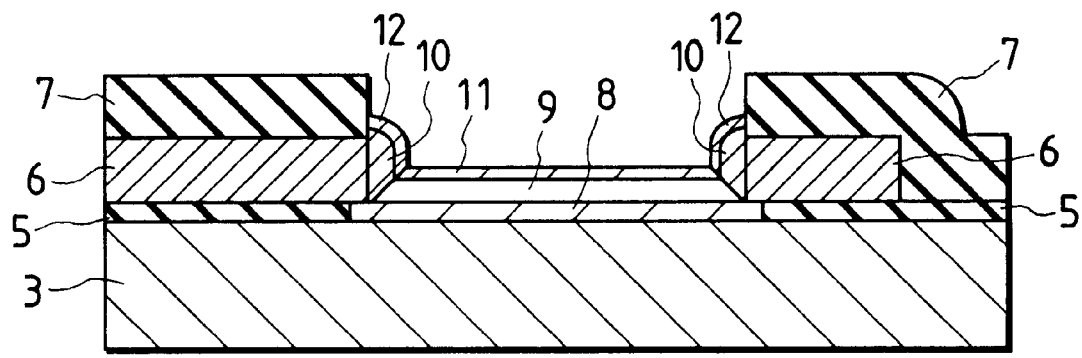
FIGS. 12A and 12B are, respectively, partially enlarged section views showing the steps subsequent to the step of FIG. 1C.

After the connection between the intrinsic base layer 9 and the extrinsic base electrode 6 through the external base 10, the low concentration cap layer 11 made of single crystal silicon (or single crystal silicon germanium) is formed in order to suppress the tunnel current at the emitter-base junction (see FIG. 12A). At this time, the low concentration polysilicon 12 (or the low concentration polysilicon germanium) is deposited on the external base 10 along with the low concentration cap layer 11. Nevertheless, since the intrinsic base layer 9 and the extrinsic base electrode 6 are connected via the external base 10, the base resistance does not increase.

Figure 12B:
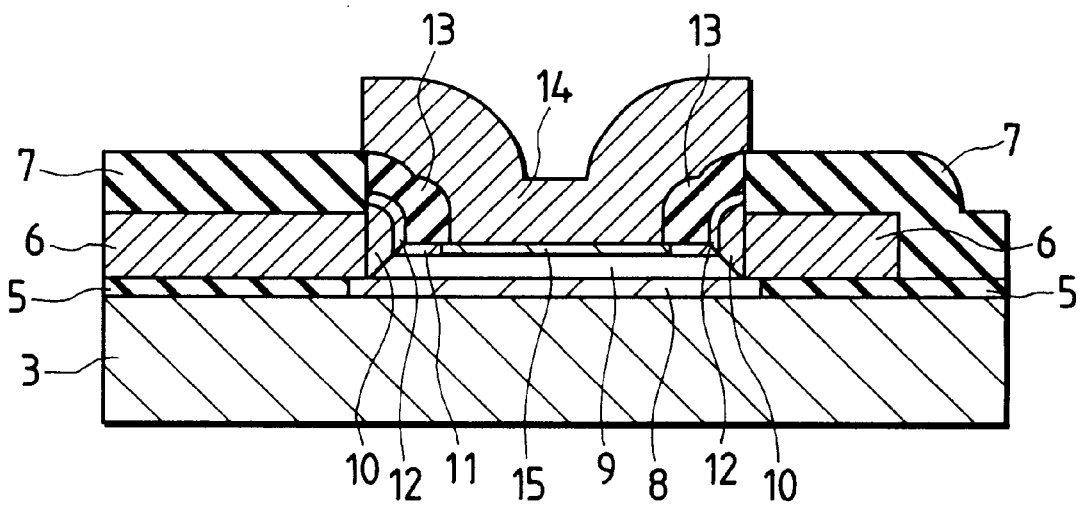

Further, the second emitter-base isolation layer 13 is formed to cover the external base 10 and the polysilicon (or polysilicon germanium) 12 therewith, after which a high concentration n-type polysilicon 14 serving as a diffusion source for emitter and an emitter electrode is deposited, followed by annealing to permit the n-type carrier to be diffused into the low concentration cap layer 11 thereby forming the emitter region 15 (see FIG. 12B).

After deposition of the insulating layer 16, an opening is formed at a collector portion of the insulating layers 5, 7 and 16 to form the high concentration n-type extrinsic collector layer 17. Likewise, openings are formed at emitter and base portions of the insulating layers 5, 7 and 16, followed by forming electrodes 18 in the respective openings of the emitter, base and collector to obtain the sectional structure shown in FIG. 10.

Embodiment 3

Figure 13:
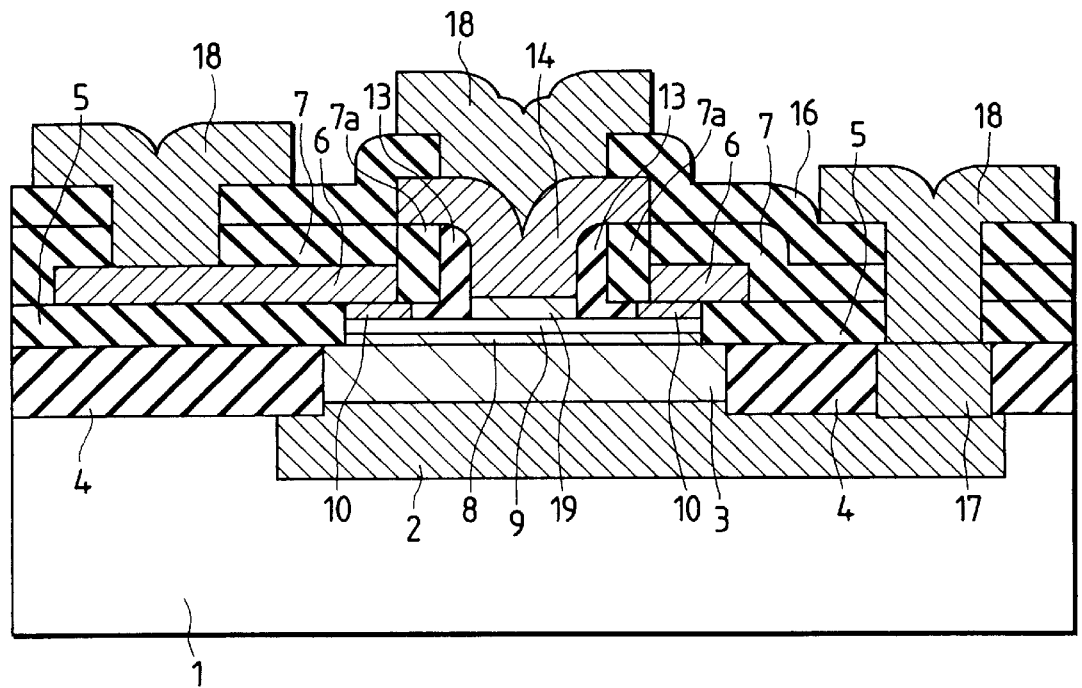
FIG. 13 is a sectional view of a bipolar transistor according to a third embodiment of the invention.

FIG. 13 is a sectional view showing the structure of a bipolar transistor according to a third embodiment of the invention. The method of fabricating a bipolar transistor having the structure of this embodiment is described below.

In the same manner as in Embodiment 1, an opening for emitter, a low concentration n-type collector layer 8, a p-type intrinsic base layer 9, and a p-type external base layer are formed, respectively. After formation of a second emitter-base isolation layer 13 is formed to cover the external base layer 10, an emitter layer 19 is formed by epitaxial growth.

Next, a high concentration n-type polysilicon 14 serving as an emitter electrode and an insulating layer 16 are successively deposited, after which an opening is made at a collector portion of the insulating layers 5, 7 and 16, in which a high concentration n-type extrinsic collector layer 17 is formed. Openings corresponding to emitter and base portions of the emitter, base and collector are, respectively, made and the electrodes 18 are formed in the respective openings for emitter, base and collector to obtain the sectional structure shown in FIG. 13.

In this embodiment, the impurity concentration in the emitter layer 19 is made smaller at the emitter-base interface, so that the leakage current in the base region can be reduced, with similar results as in Embodiment 1. Moreover, since the emitter layer 19 is formed by epitaxial growth, the impurity concentration in the emitter layer and the layer thickness can be appropriately controlled, thereby reducing a variation in performance of the resulting transistor.

Additionally, the interfacial area of the emitter-base can be reduced, resulting in the reduction in the capacitance between the emitter and the base. Thus, circuitries using this transistor can be improved in characteristics.

Embodiment 4

Figure 14:
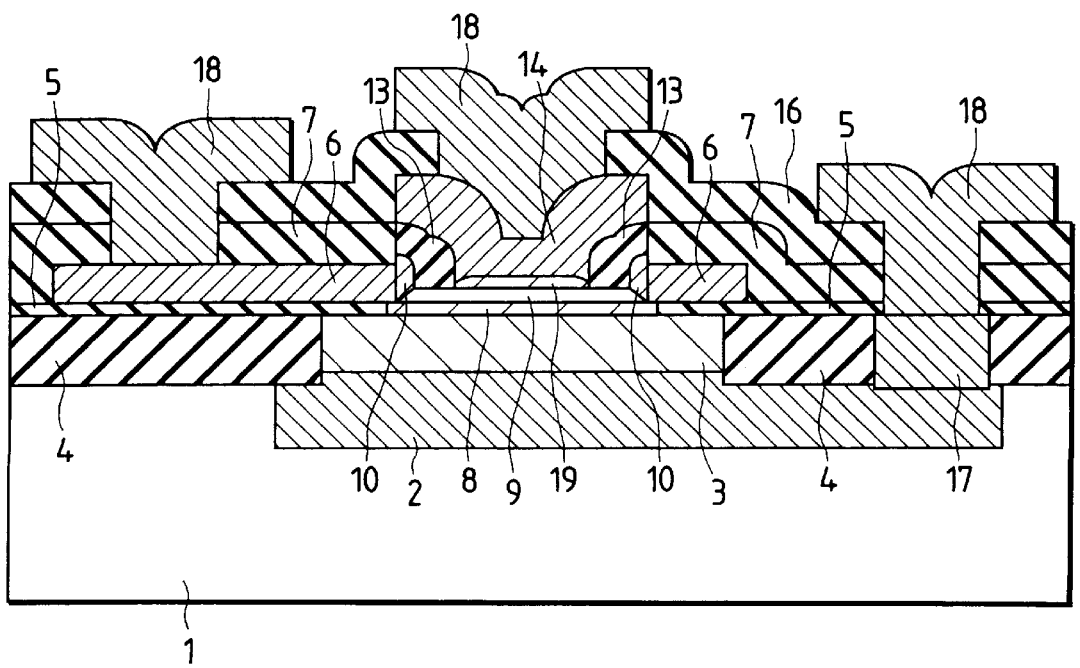
FIG. 14 is a sectional view of a bipolar transistor according to a fourth embodiment of the invention.

FIG. 14 is a view showing a sectional structure of a bipolar transistor according to a fourth embodiment of the invention. In this embodiment, the thickness of a collector base isolation layer 5 is substantially equal to that of a low concentration n-type collector layer 8, like Embodiment 2. Thus, the degree of etching can be reduced when the collector base isolation layer 5 is formed with an opening by etching. In the same manner as in Embodiment 2, an opening for emitter, a low concentration n-type collector layer 8, a p-type intrinsic base layer 9, and a p-type external base layer 10 are, respectively, formed. Thereafter, an emitter layer 19 is formed by epitaxial growth in the same manner as in Embodiment 3, so that the impurity concentration in the emitter layer 19 and the layer thickness can be appropriately controlled, leading to the reduction in variation of transistor performance. Accordingly, like Embodiment 3, circuitries using the transistor of this embodiment can be improved in characteristics.

Embodiment 5

Figure 15A:
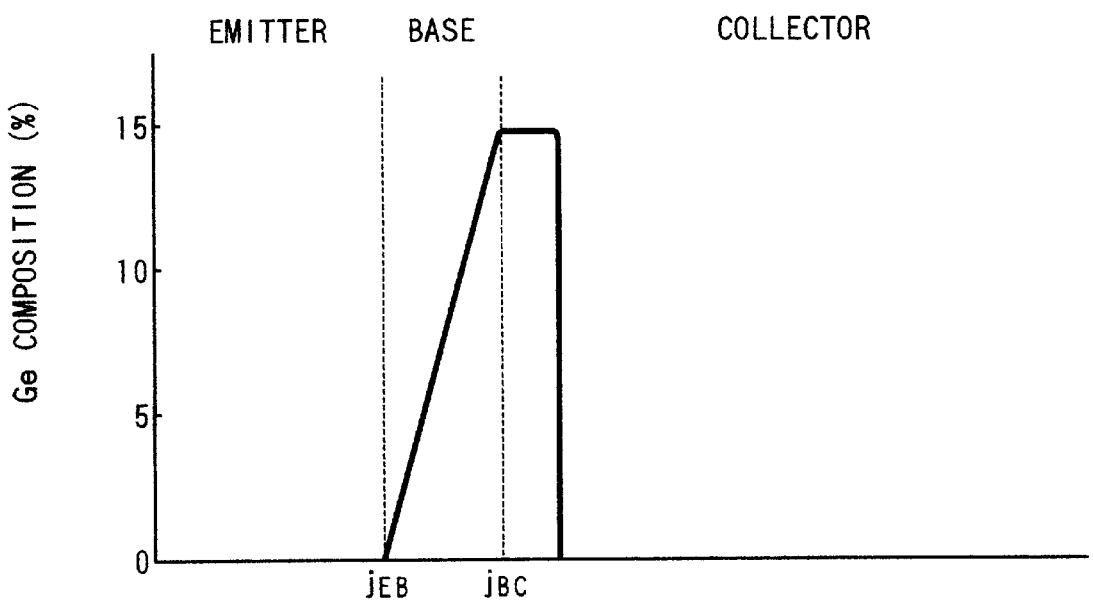
FIG. 15A is a characteristic graph showing a compositional ratio of germanium in a bipolar transistor according to a fifth embodiment of the invention.
Figure 15B:
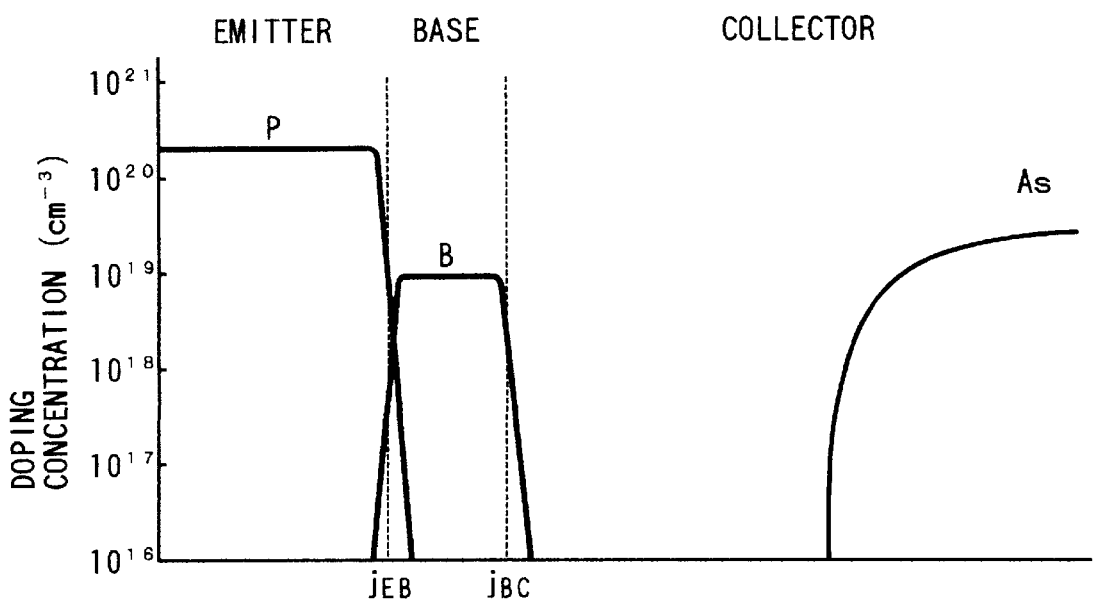
FIG. 15B is a characteristic graph showing concentration profiles of impurities in the bipolar transistor according to the fifth embodiment of the invention.

FIGS. 15A and 15B are graphs relating to a bipolar transistor according to a fifth embodiment of the invention wherein FIG. 15A is a graph showing a compositional ratio of germanium in the transistor and FIG. 15B is a graph showing concentration profiles of impurities. The structure of the transistor to which the characteristics of these figures are applicable may be any one of those shown in FIGS. 1, 10, 13 and 14. In this embodiment, any sectional structure is not particularly shown. With regard to reference numerals used herein for illustration, reference may be made, for example, to the view of the sectional structure of FIG. 1. This is true of the cases of Embodiments 6 to 8 appearing hereinafter.

Figure 16:
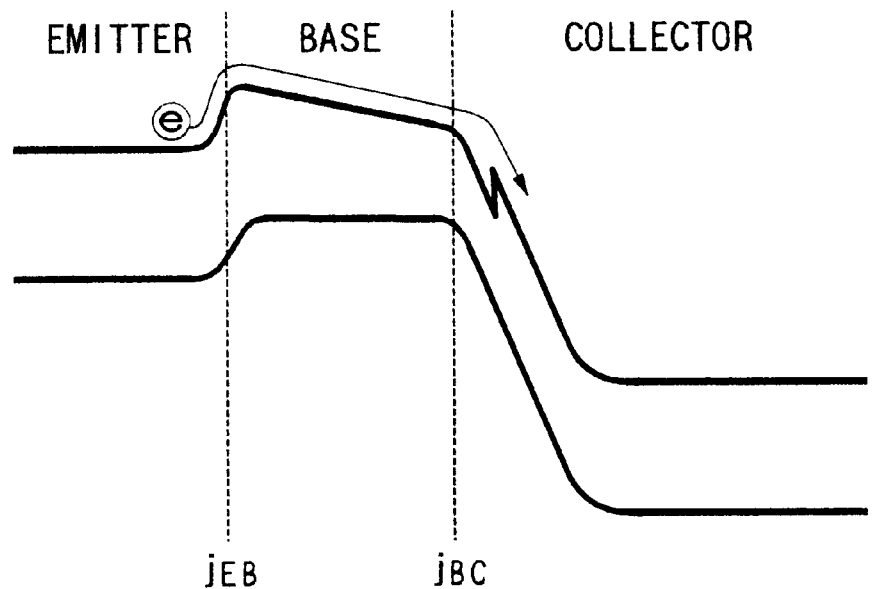
FIG. 16 is a schematic view showing an energy band structure of the bipolar transistor of the invention having such profiles as shown in FIGS. 15A and 15B.

As shown in FIG. 15A, the compositional ratio of germanium in the intrinsic base layer 9 of the transistor of this embodiment decreases from the collector side toward the emitter side. The energy band structure in this condition is shown in FIG. 16. FIG. 16 reveals that the energy band is inclined relative to the compositional ratio of germanium in the base layer. The carriers charged from the emitter are accelerated in the base layer owing to the electric field ascribed to the inclined energy band, enabling one to attain higher speed operations of the transistor. When using this type of transistor, the circuit characteristics can be further improved while attaining those effects having set out with respect to Embodiments 1 to 4. It will be noted that as shown in the impurity concentration profiles in FIG. 15B, the impurity concentration at the emitter-base junction, $J_{EB}$, of this embodiment is lower than that of the prior art shown in FIG. 3B. Thus, the tunnel current at the emitter-base junction can be reduced.

Embodiment 6

Figure 17A:
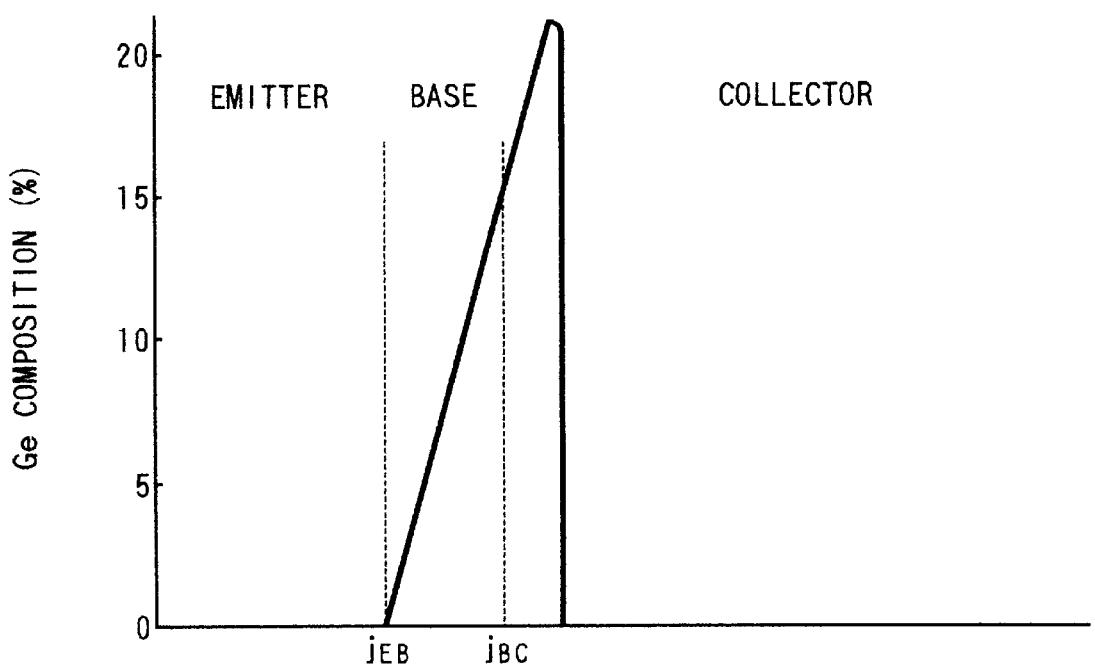
FIG. 17A is a characteristic graph showing the compositional ratio of germanium of a bipolar transistor according to a sixth embodiment of the invention.
Figure 17B:
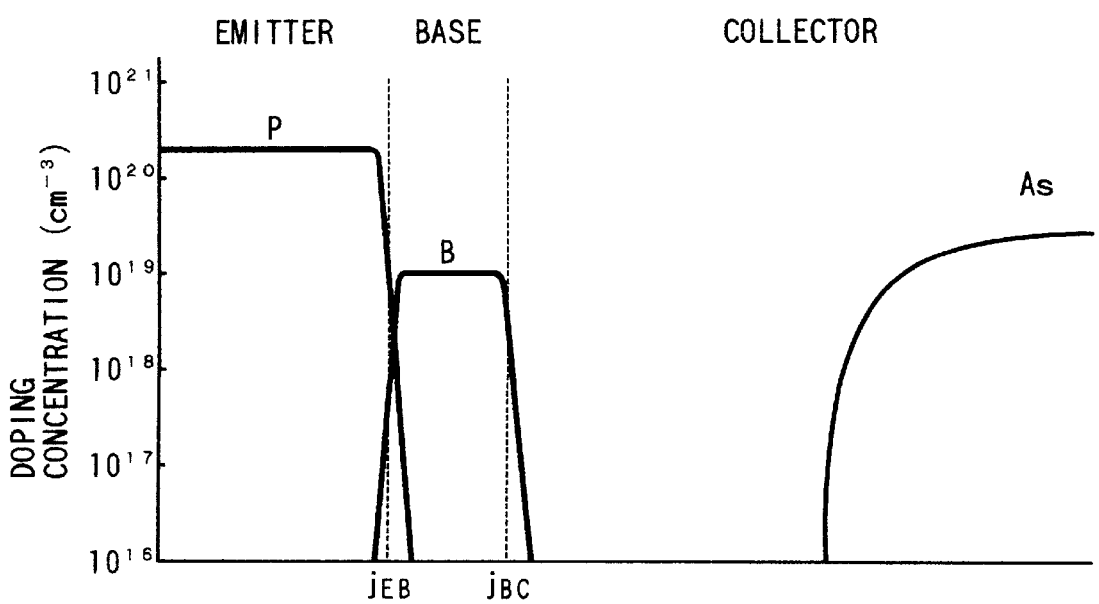
FIG. 17B is a characteristic graph showing concentration profiles of impurities in the bipolar transistor according to the sixth embodiment of the invention.

FIGS. 17A and 17B are characteristic graphs of a bipolar transistor according to a sixth embodiment of the invention wherein FIG. 17A shows a compositional ratio of germanium in the transistor, and FIG. 17B shows impurity concentration profiles. The structure of the transistor to which the characteristics of these figures are applicable may be any one of those shown in FIGS. 1, 10, 13 and 14. Accordingly, any sectional structure is not particularly shown, like Embodiment 5.

Figure 18:
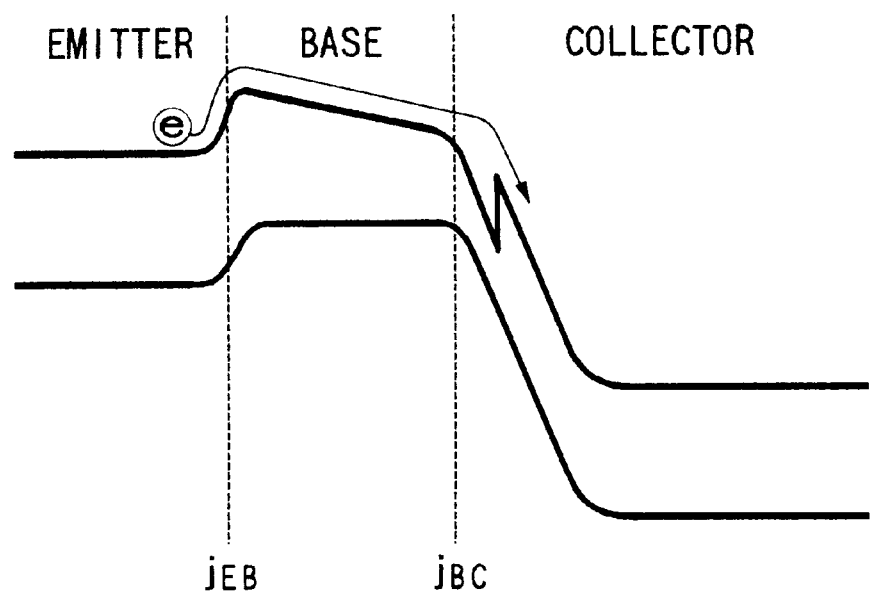
FIG. 18 is a schematic view showing an energy band structure of the bipolar transistor of the invention having such profiles as shown in FIGS. 17A and 17B.

As shown in FIG. 17A, the transistor of this embodiment is so arranged that the compositional profile of germanium decreases from the collector side toward the emitter side not only in the intrinsic base layer 9, but also in the low concentration n-type collector layer 8. The energy band structure in this case is shown in FIG. 18. As will be seen from FIG. 18, in addition to the inclined energy band in the base layer, the energy band in the depletion layer between the collector and the base can be inclined. In this arrangement, the carriers charged from the emitter is accelerated not only in the base layer and in the depletion layer at the collector base interface, but also in the low concentration n-type collector layer 8. The resultant transistor is operable at a higher speed. Using this type of transistor, the circuit characteristics can be further improved while showing the effects attained in Embodiment 5.

Embodiment 7

Figure 19A:
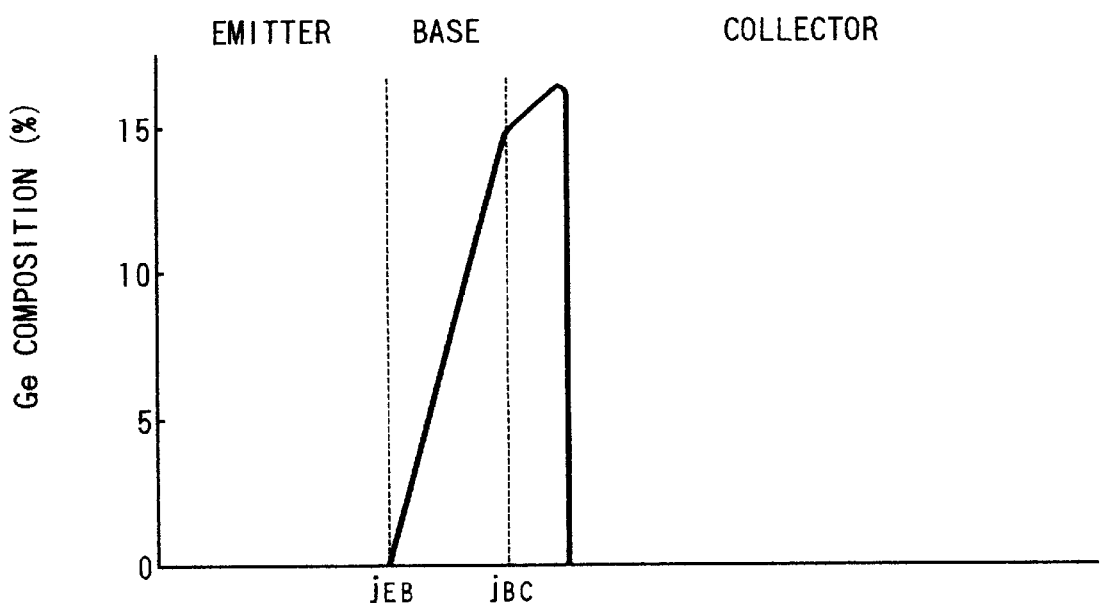
FIG. 19A is a characteristic graph showing the compositional ratio of germanium of a bipolar transistor according to a seventh embodiment of the invention.
Figure 19B:
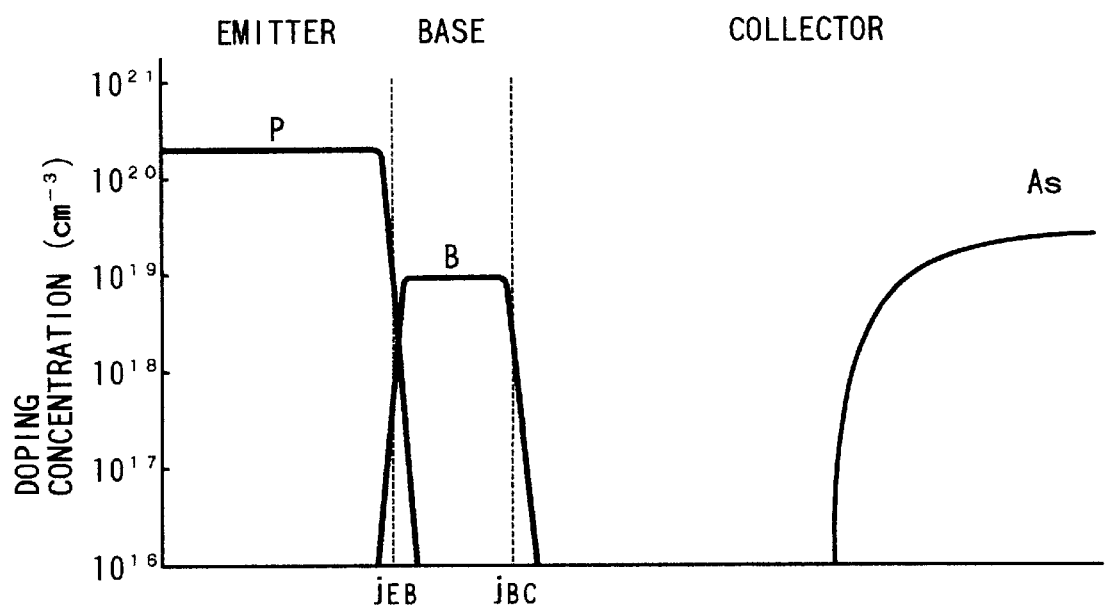
FIG. 19B is a characteristic graph showing concentration profiles of impurities in the bipolar transistor according to the seventh embodiment of the invention.

FIGS. 19A and 19B are characteristic graphs of a bipolar transistor according to a seventh embodiment of the invention wherein FIG. 19A shows a compositional ratio of germanium in the transistor, and FIG. 19B shows impurity concentration profiles. The structure of the transistor to which the characteristics of these figures are applicable may be any one of those shown in FIGS. 1, 10, 13 and 14. Accordingly, any sectional structure is not particularly shown, like Embodiment 5.

The transistor of this embodiment is similar to the transistor of Embodiment 6 in that the compositional profile of germanium decreases from the collector side toward the emitter side not only in the intrinsic base layer 9, but also in the low concentration n-type collector layer 8. In this connection, however, with the transistor of this embodiment, the inclinations of the profiles in the intrinsic base layer 9 and in the low concentration n-type collector layer 8 differ from each other. More particularly, the transistor of this embodiment differs from that of Embodiment 6 in that the compositional ratio of germanium at the side of the collector is less than a maximum level at which any defect is not incorporated in the low concentration n-type collector layer 8 and the intrinsic base layer 9 as will be caused by strains.

Figure 20:
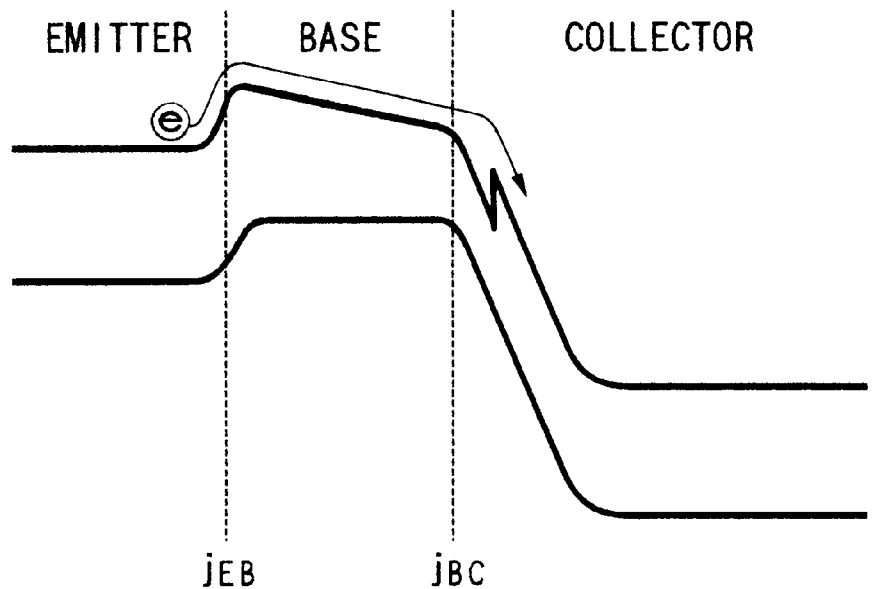
FIG. 20 is a schematic view showing an energy band structure of the bipolar transistor of the invention having such profiles as shown in FIGS. 19A and 19B.

The energy band structure in this case is shown in FIG. 20. In addition to the inclined energy band in the base layer, the energy band in the depletion layer between the collector and the base can be inclined and the leakage current ascribed to crystal defects can be reduced using this type of transistor, the circuit characteristics can be further improved while showing the effects of Embodiment 6.

Embodiment 8

Figure 21A:
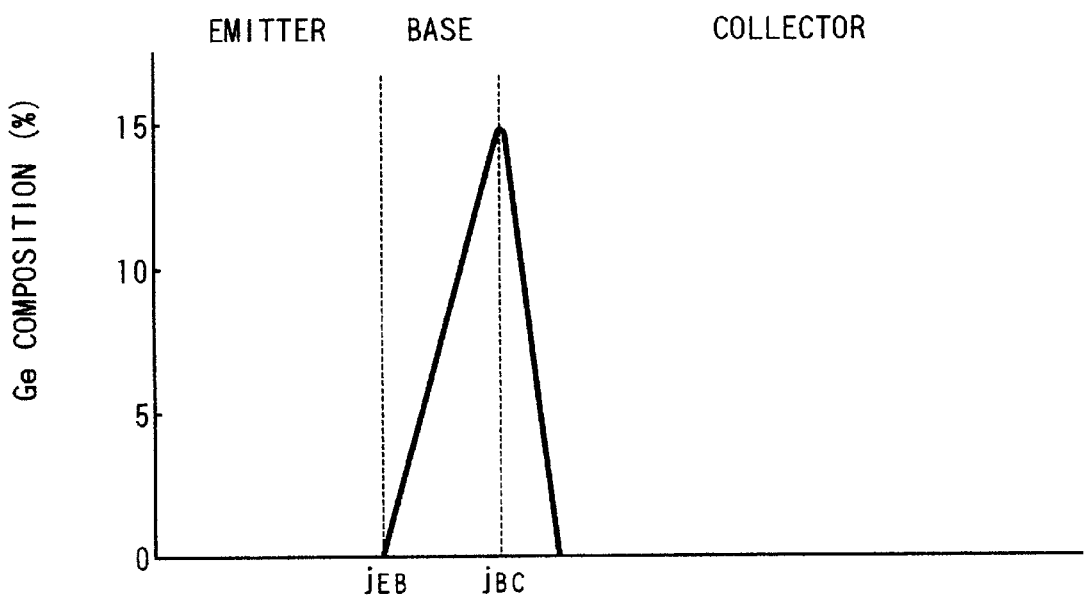
FIG. 21A is a characteristic graph showing the compositional ratio of germanium of a bipolar transistor according to an eighth embodiment of the invention.
Figure 21B:
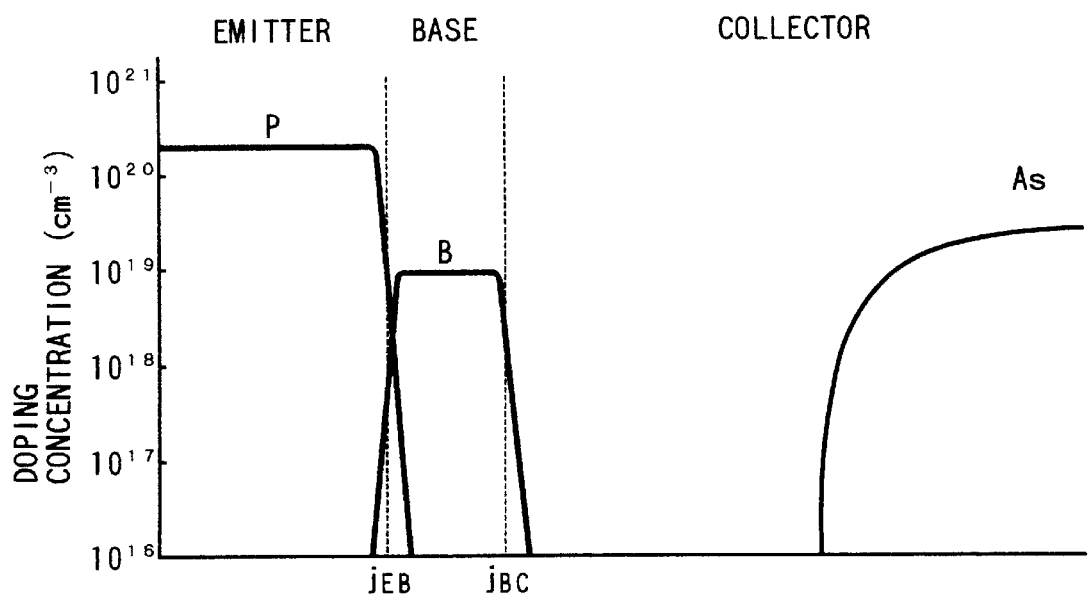
FIG. 21B is a characteristic graph showing concentration profiles of impurities in the bipolar transistor according to the eighth embodiment of the invention.

FIGS. 21A and 21B are characteristic graphs of a bipolar transistor according to an eighth embodiment of the invention wherein FIG. 21A shows a compositional ratio of germanium in the transistor, and FIG. 21B shows impurity concentration profiles. The structure of the transistor to which the characteristics of these figures are applicable may be any one of those shown in FIGS. 1, 10, 13 and 14. Accordingly, any sectional structure is not particularly shown, like Embodiment 5.

Figure 22:
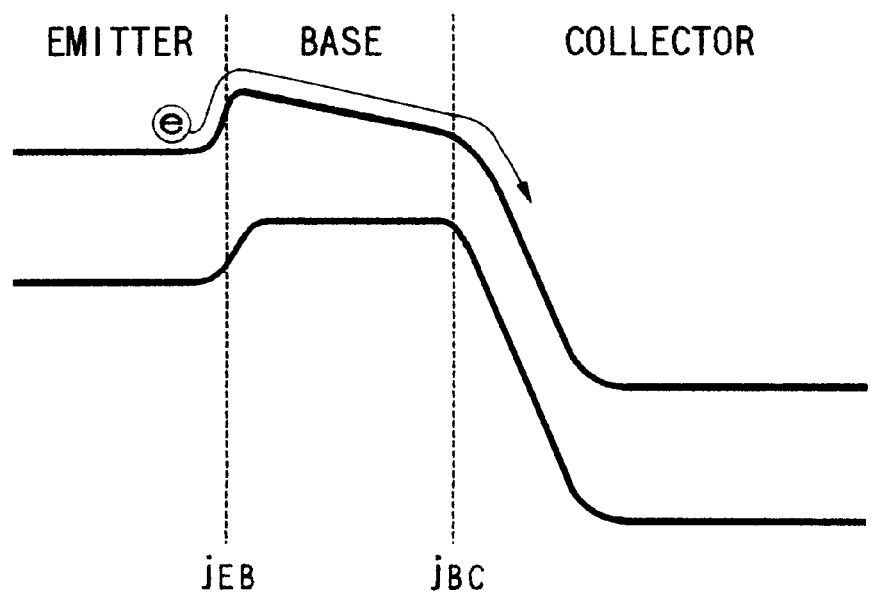
FIG. 22 is a schematic view showing an energy band structure of the bipolar transistor of the invention having such profiles as shown in FIGS. 21A and 21B.

The compositional ratio of germanium in the intrinsic base layer 9 of the bipolar transistor of this embodiment is made smaller from the collector side toward the emitter side. In the low concentration n-type collector layer 8, the compositional ratio of germanium is made smaller toward the collector side. The energy band structure of the transistor is shown in FIG. 22. As shown in FIG. 22, there is no energy barrier at the interface between the first low concentration n-type collector layer 3 and the second low concentration n-type collector layer 8 in this embodiment. The carriers accelerated with the assistance of the inclination of the energy band in the intrinsic base layer 9 arrive at the collector without suffering any influence of the energy barrier. As a consequence, higher speed operations of the transistor becomes possible. Circuitries using this type of transistor ensure more improved high speed operations, aside from the effects attained in Embodiments 1 to 4.

Embodiment 9

Figure 23:
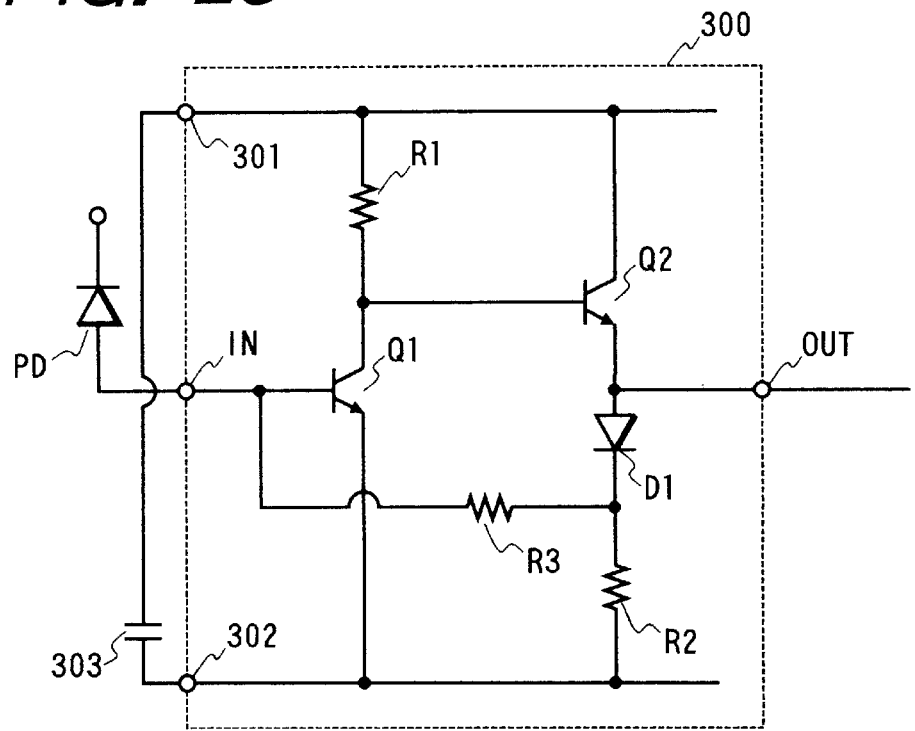
FIG. 23 is a circuit diagram of a pre-amplifier circuit for an optical communication system to which the bipolar transistor of the invention is applied.

FIG. 23 is a view showing a ninth embodiment using bipolar transistors of the invention and is more particularly a circuit diagram of a pre-amplifier circuit used in an optical communication system. As is well known in the art, the optical communication system requires high speed transmission on the order of several tens of Gb/second and, especially, its pre-amplifier circuit has to be worked at high speed. When using the transistor of the invention as a transistor for the amplifier circuit, the overall performance of the amplifier circuit can be remarkably improved.

In FIG. 23, reference numeral 300 indicates a semiconductor integrated circuit constituting a pre-amplifier formed on a single semiconductor substrate. An input terminal IN of the semiconductor integrated circuit 300 is externally connected with a photodiode PD, and a de-coupling capacitor 303 is externally connected between a voltage supplier terminal 301 and a ground terminal 302. The photodiode PD is a light receiving device for receiving optical signals transmitted via an optical transmission cable, and the de-coupling capacitor 303 is a capacitor which serves to short-circuit an AC component between the voltage supplier line and the ground line.

Bipolar transistors Q1 and Q2 are ones which constitute an amplifier circuit. For this purpose, any of the bipolar transistors of the invention having such structures as illustrated in Embodiments b 1to 8 may be favorably used. Diode D1 is a diode for level shifting and may be obtained by short-circuiting between the base and the collector of a bipolar transistor of the invention. Alternatively, a plurality of diodes which are connected in series may be used, if necessary. Reference numerals R1, R2 and R3 are, respectively, a resistor, and OUT indicates an output terminal. If necessary, a output buffer circuit may be inserted between the output terminal OUT and the emitter of the transistor Q2.

The semiconductor integrated circuit 300 constituting the pre-amplifier circuit of the optical communication system of this embodiment is so operated that an optical signal transmitted through the optical transmission cable is converted into an electric signal by means of the photodiode PD, followed by inputting to the input terminal IN. The inputted electric signal is amplified by means of the amplifier transistors Q1 and Q2 and outputted from the output terminal OUT. Using any of the bipolar transistors of the invention illustrated in Embodiments 1 to 8, it is possible to realize that the pre-amplifier circuit of the embodiment has a band characteristic of 40 GHz or above.

The pre-amplifier circuit for the 40 Gb/second optical communication system should have such a performance that its band with a gain reduction of −3 dB in the frequency characteristic is 40 Gb/second. To this end, the bipolar transistor used should satisfy the requirements that cutoff frequency, $f_T \geq 100$ GHz, base resistance, $r_{bb}' \leq 100$ Ω, and collector junction capacitance, $C_{TC}$, $\leq 2fF$. In order to satisfy the requirements, the bipolar transistor having a structure, for example, of FIG. 1 is so designed that it has an emitter width, $W_E$, of 0.2 μm, an emitter length, $L_E$, of 2 μm, an amount of carrier concentration in the base layer, $N_B$, of $1 \times 10^{19}$ cm$^{-3}$, a base width, $W_B$, of 30 nm, and a doping amount of the high concentration n-type polysilicon used as a diffusion source for emitter of $2 \times 10^{20}$ cm$^{-1}$, wherein the emitter is annealed under conditions of 900° C. and approximately 30 seconds.

Figure 24:
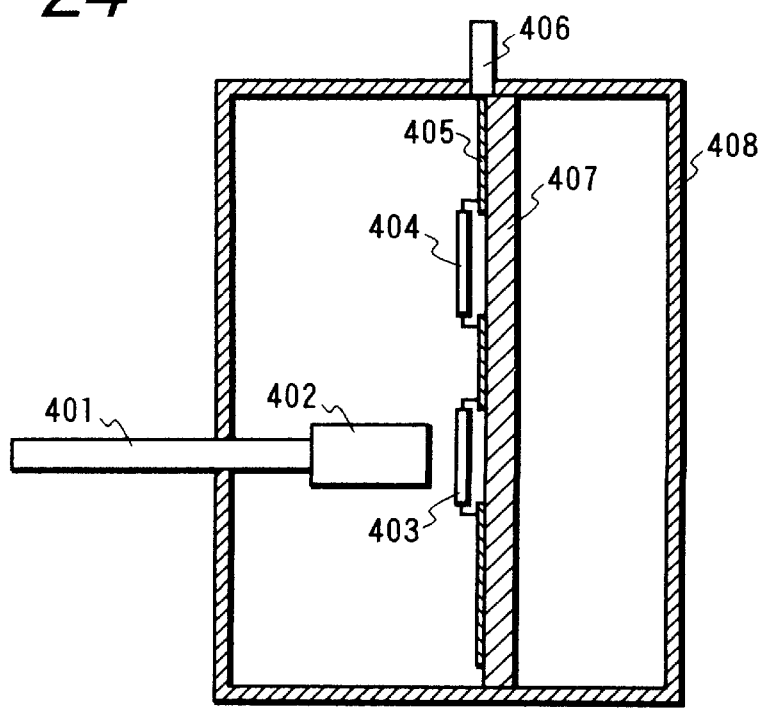
FIG. 24 is a sectional view of a front end module of the optical communication system shown in FIG. 23 in which the pre-amplified circuit is integrated on a mounting board.

The sectional view of a front end module of the optical communication system wherein the photodiode PD and the pre-amplifier circuit are integrated on a mounting board is shown in FIG. 24. In FIG. 24, reference numeral 401 indicates an optical fiber, reference numeral 402 indicates a lens, reference numeral 403 indicates a photodiode, and reference numeral 404 indicates a semiconductor integrated circuit including a pre-amplifier.

The photodiode 403 and the pre-amplifier IC 404 are mounted on a board 407. The photodiode 403 and the pre-amplifier IC 404 are connected to an output terminal 406 via a wiring 405 connecting the diode and the amplifier. The board 407 is encased in a hermetically sealed package 408 such as a metallic case. Although not shown, a capacitor 303 shown in FIG. 23 is mounted on the board 407. The photodiode and the pre-amplifier which constitute the front end are arranged in the same module, so that the signal path can be shortened. This leads to little likelihood of noise generation and can suppress a parasitic L component (inductance component) or a C component (capacitance component) at a low level.

In the front module shown in FIG. 24, the optical signal inputted from the optical fiber 401 is focused by means of the lens 402 and is converted to an electric signal by means of the photodiode 403. This electric signal is amplified in the pre-amplifier IC403 through the wiring 405 on the board 407 and outputted from the output terminal 406.

Figure 25:
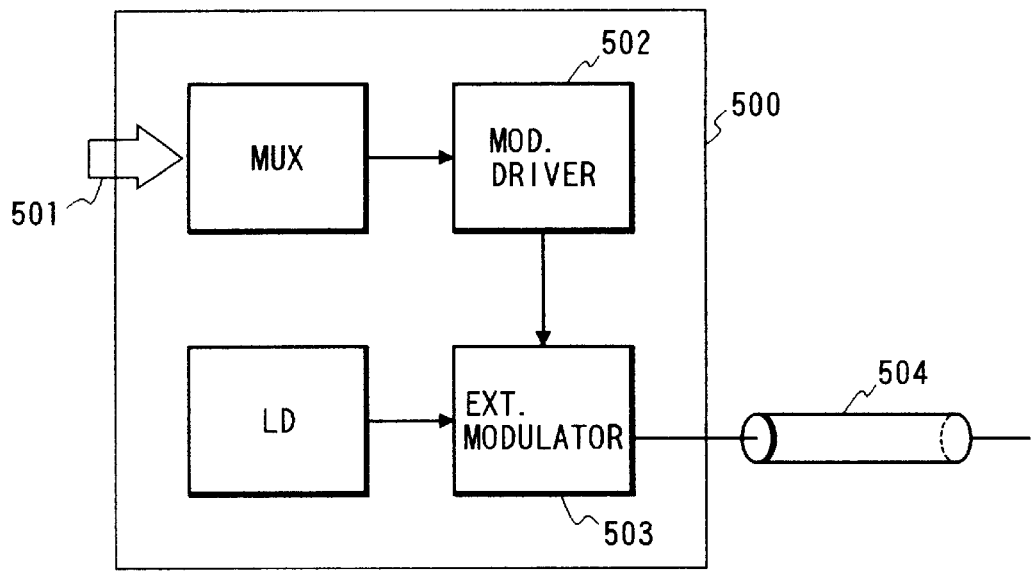
FIG. 25 is a block diagram of a transmitter module of the optical communication system utilizing the circuit and the module shown in FIGS. 23 and 24.
Figure 26:
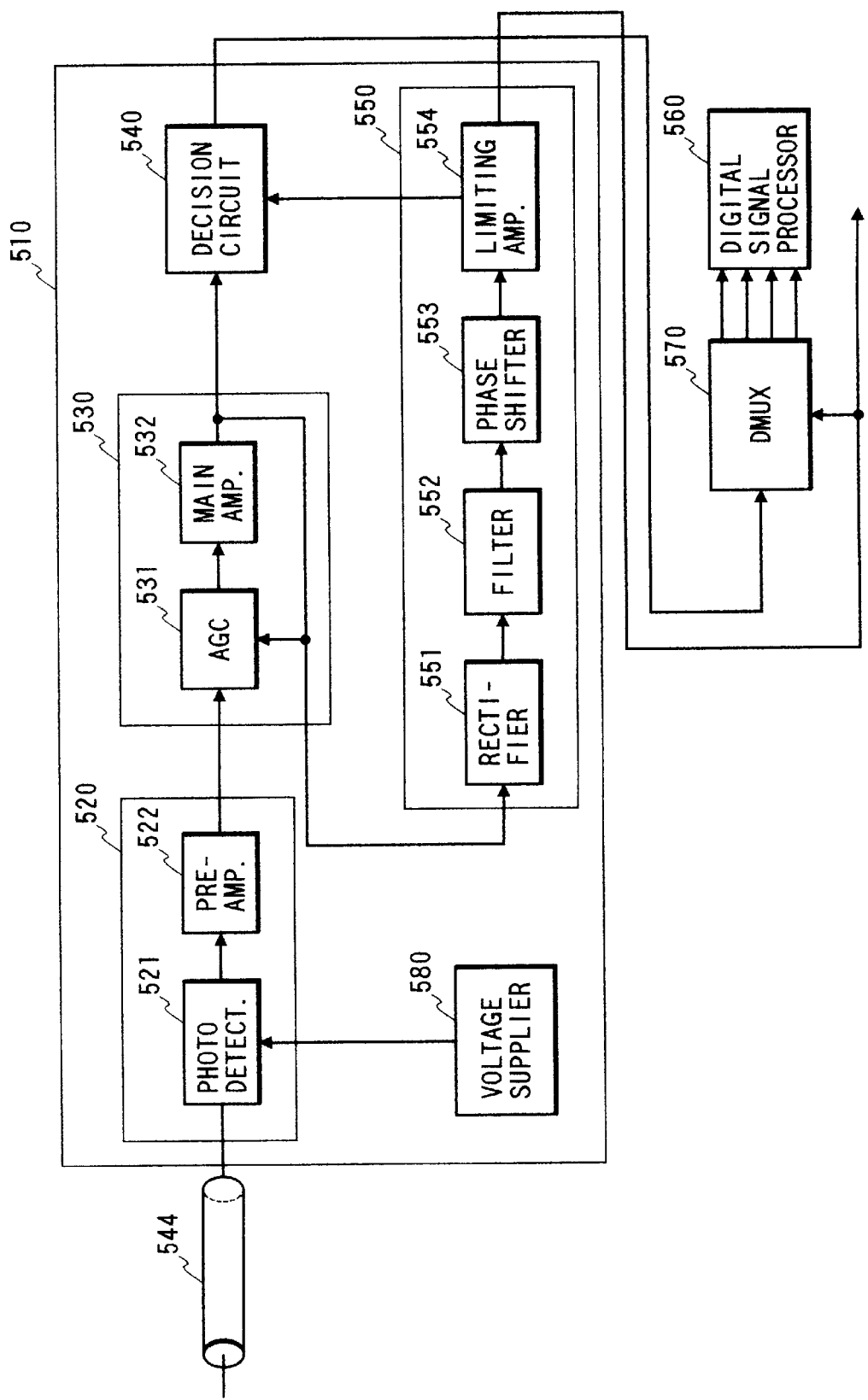
FIG. 26 is a block diagram of a photo detection-type module of the optical communication system utilizing the circuit and the module shown in FIGS. 23 and 24.

FIGS. 25 and 26 show an optical communication system arrangement using the pre-amplifier circuit and the front end module shown in FIGS. 23 and 24, respectively.

FIG. 25 shows a transmitting module 500 of the optical communication system. An electric signal 501 to be transmitted is inputted to a multiplexer MUX wherein it is multiplexed, for example, at 4:1. The resultant output signal is sent to a driver 502. A semiconductor laser LD invariably outputs a beam of a given intensity. The output beam from the semiconductor laser LD is transmitted to an optical fiber 504 via an external modulator 503 capable of absorbing or non-absorbing a beam depending on the output of a driver 502. The transmitter module shown in FIG. 25 is of a so-called external modulation type. Instead, it is possible to adopt a direction modulation type wherein the emission from the semiconductor laser LD is directly controlled. In general, the transmission from the external modulation type module is suitable for high-speed and long-distance transmission because its spectral oscillation is less spread owing to chirping.

FIG. 26 shows an optical receiver module 510 of the optical communication system. In FIG. 26, reference numeral 520 indicates a front end module unit. The front end module unit 520 includes a photo detector 521 wherein an optical signal transmitted through an optical fiber 544 is converted into an electric signal and outputted, and a pre-amplifier 522 for amplifying an output from the detector. The electric signal amplified with the pre-amplifier 522 is inputted to a main amplifier unit 530 wherein it is further amplified. The main amplifier unit 530 is so arranged that in order to keep a constant output while avoiding any variation as will be caused by an optical communication distance or a lot-to-lot deviation, the output of a main amplifier 532 is fed back to an automatic gain controller (AGC) 531. The main amplifier unit 530 may be not only of the type wherein the gain is controlled, but also may be a limiting amplifier wherein the amplitude of an output is limited. Reference numeral 580 is a voltage supplier for the photo detector 521.

A decision circuit 540 is so arranged as to perform one bit analog-digital conversion in synchronism with a given clock, so that the output of the main amplifier unit 530 is digitized. This digital signal is de-multiplexed with a de-multiplexer DMUX, for example, at 1:4, and is inputted to a subsequent digital signal processor 560 wherein it is processed as required.

A clock extractor unit 550 is to form a clock for controlling the operation timings of the decision circuit 540 and the de-multiplexer DMUX from the converted electric signal. In the clock extractor unit 550, the output from the main amplifier unit 530 is rectified in a rectifier 551 and is filtered with a narrow-band filter 552 to extract a clock signal. The output of the filter 552 is inputted to a phase shifter 553. The phase shifter 553 is one wherein the filter output and the phase of the analog signal are matched, i.e. the filter output is delayed on the basis of a predetermined quantity of delay. The output of the phase shifter 553 is inputted to the decision circuit 540 and DMUX 570 through a limiting amplifier 554.

In the optical communication system set out hereinabove, the bipolar transistors of the invention illustrated in Embodiments 1 to 8 may be used to constitute various types of circuits used in the system. Likewise, the circuit for the main amplifier 532 may be one which is shown in FIG. 23.

The bipolar transistor of the invention fabricated according to the embodiments can be operated at such a high speed that the cutoff frequency, $f_T$ and the maximum cutoff frequency, $f_{max}$, are as high as 100 GHz, so that signals of a large capacitance of 40 Gbits per second can be transmitted and received at high speed. In prior art circuits necessary for high-speed operations, it has been necessary to use a GaAs transistor whose operation speed is higher than a silicon bipolar transistor. However, the inexpensive silicon bipolar transistor of the invention can be applied to such circuits as mentioned above, enabling one to reduce the total cost of the optical communication system.

Embodiment 10

Figure 27:
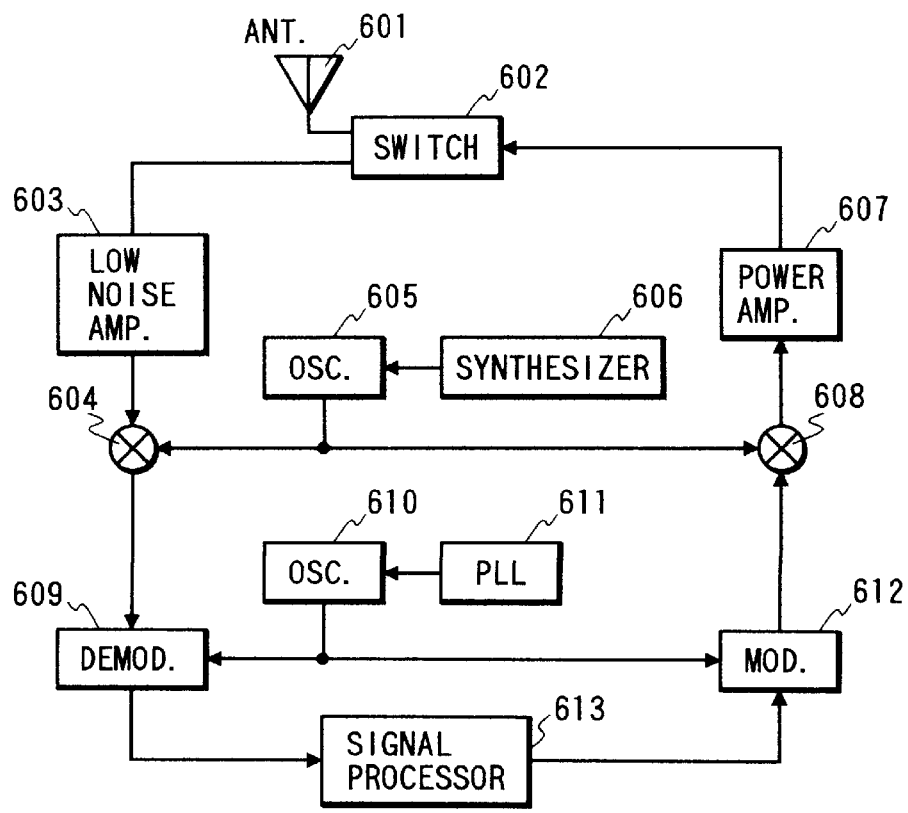
FIG. 27 is a black diagram of a mobile wireless transceiver to which the bipolar transistor of the invention is applied.

FIG. 27 is a view showing a tenth embodiment using the bipolar transistors of the invention and is more particularly a block diagram of a mobile wireless transceiver to which the bipolar transistors of the invention are applied. In this embodiment, the bipolar transistors of the invention illustrated in Embodiments 1 to 8 are applied to circuits of the respective blocks of the mobile wireless transceiver such as a low noise amplifier 603, a synthesizer 606, a PLL (phase locked loop) 611 and the like.

The mobile wireless transceiver shown in FIG. 27 is operated in the following manner. An input signal from an antenna 601 is amplified in a low noise amplifier 603. An oscillator 605 is oscillated by means of a frequency synthesized in a synthesizer 606, and the signal from the low noise amplifier 603 is subjected to down conversion into a lower frequency by means of a down mixer 604 by use of the signal emitted from the oscillator 605.

An oscillator 610 oscillates the input signal by means of a frequency generated in PLL 611, and a signal from the down mixer 604 is de-modulated in a de-modulator 609 using the signal emitted from the oscillator 610. The thus de-modulated signal is processed in a signal processor dealing with a lower frequency.

The signal generated from the signal processor 613 is modulated in the modulator 612 by use of the signal from PLL 611. The thus modulated signal is up converted into a high frequency in an up mixer 608 by use of the signal which is oscillated with the oscillator 605 based on the signal synthesized by means of the synthesizer 606. The high frequency signal is amplified with the power amplifier 607 and transmitted to the antenna 601.

It will be noted that a switch 602 is one which switches over transmission to reception and vice versa of a signal, and receives a control signal, not shown, from the signal processor 613 to control whether the signal is transmitted or received. The signal processor 613 is connected with a speaker or a microphone not shown, enabling one to input or output sound signals.

Any of the bipolar transistors set out in Embodiments 1 to 8 may be applied to the respective blocks of the mobile wireless transceiver shown in FIG. 27, and particularly to the blocks of the low noise amplifier 603, the synthesizer 606 and PLL 611 to constitute the respective circuits. The transistor of the invention can be reduced in base resistance and base collector capacitance, so that when such a transistor is, respectively, applied to the low noise amplifier 603, the synthesizer 606 and PLL 611, it is possible to reduce noises and power consumption. Thus, a mobile wireless transceiver which is low in noise as a whole and is usable over a long term can be realized.

Embodiment 11

Figure 28:
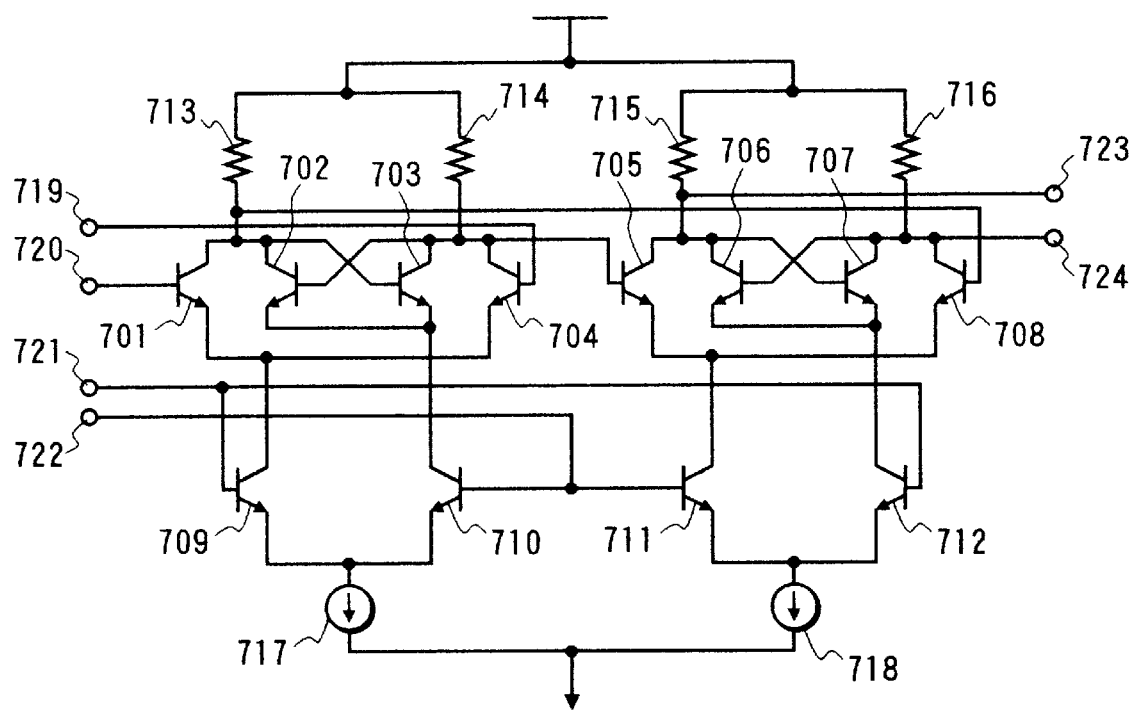
FIG. 28 is a circuit diagram of a D flip flop for prescaler of PLL of a mobile wireless transceiver to which the bipolar transistor of the invention is applied.

FIG. 28 is a view showing an eleventh embodiment using the bipolar transistors of the invention and is more particularly a circuit diagram of a D flip flop for a PLL prescaler of a mobile wireless transceiver to which the bipolar transistors of the invention are applied.

In this embodiment, the bipolar transistors of the invention illustrated in Embodiments 1 to 8 are used as transistors 701 to 712 of circuits shown in FIG. 28.

The input signal of the D flip flop circuit, the clock signal and the output signal, respectively, have only two states of high and low potentials. The input signal and the reverse input signal are, respectively, inputted to terminals 719 and 720, and the clock signal and the reverse clock signal are, respectively, terminals 721 and 722. An output signal and a reverse output signal are, respectively, obtained from terminals 723 and 724.

The current paths passing through current sources 718 and 719, respectively, change to either a transistor 709 or a transistor 710 and a transistor 711 or a transistor 712 by means of the clock signal. The on-off operation of each of transistors 701 to 706 is determined by the input signal, the clock signal, a potential at a low end of resistors caused by a current passing through resistors 713 and 714. An input value is outputted as an output signal of this circuit where the clock signal is changed from low to high potential, otherwise a pre-input value is kept as it is.

The circuit of this embodiment may be constituted using any of the bipolar transistors of the invention illustrated in Embodiments 1 to 8. The transistors of the invention can be reduced in the base resistance and the capacitance between the base and the collector, enabling one to realize a reduced power consumption of PLL of mobile wireless transceivers.

As stated hereinabove, according to the invention, since any energy barrier is not established at the collector base interface, the transmit time of the carriers charged from the emitter is shortened, enabling the high-speed operation of the transistor. The intrinsic base and the extrinsic base electrode are connected via the doped external base thereby reducing the base resistance. This also leads to the high-speed operation of a circuit using the bipolar transistor. Moreover, the emitter-base-collector are self-alignedly formed, so that the capacitances between the emitter and the base and between the collector and the base can be reduced, thus making it possible to operate the circuit using the bipolar transistor at high speed.

The bipolar transistor of the invention and its fabrication method are able to reduce the capacitance between the emitter and the base, the capacitance between the base and collector, and the base resistance. The bipolar transistor which is high in speed and operable at a high frequency is obtained.

Using the bipolar transistor of the invention in circuits or systems necessary for high-speed operations, it is possible to improve the performance of the circuit and the system.

Preferred embodiments of the invention have been described hereinabove. It should be noted that the invention should not be construed as limiting to these embodiments, and various variations may be possible without departing from the spirit of the invention.

What is claimed is:

1. A bipolar transistor comprising, at least:

a multilayered film which includes a single crystal silicon layer of a first conductivity type, a first insulating layer formed on the surface of said single crystal silicon layer of the first conductivity type and having an opening therein, a polycrystalline layer of a second conductivity type opposite to the first conductivity type, and a second insulating layer;

a single crystal silicon germanium layer of the first conductivity type formed in the opening;

a single crystal silicon germanium layer of the second conductivity type formed on said single crystal silicon germanium layer of the first conductivity type;

a polysilicon germanium layer formed in contact with both said single crystal silicon germanium layer of the second conductivity type and said polycrystalline layer of the second conductivity type; and a second single crystal layer of the second conductivity type which is formed on said single crystal silicon germanium layer of the second conductivity type and is lower in impurity concentration than said single crystal silicon germanium layer of the second conductivity type.

2. A bipolar transistor according to claim 1, wherein said polycrystalline layer of the second conductivity type consists of a polysilicon layer or a polysilicon germanium layer.

3. A bipolar transistor according to claim 1, wherein said single crystal silicon germanium layer of the first conductivity type has a thickness of at least 5 nm.

4. A bipolar transistor according to claim 1, wherein said second single crystal layer of the second conductivity type consists of a single crystal silicon layer or a single crystal silicon germanium layer.

5. A bipolar transistor according to claim 1, wherein said single crystal silicon germanium layer of the second conductivity type has a compositional ratio of germanium which decrease from the side of said first single crystal silicon of the first conduction type toward the surface.

6. A bipolar transistor according to claim 1, wherein compositional ratios of germanium in said single crystal silicon germanium layer of the second conductivity type and in said single silicon germanium layer of the first conductivity type, respectively, decrease from the side of said single crystal silicon of the first conductivity type toward the surface.

7. A bipolar transistor according to claim 1, wherein compositional ratios of germanium in said single crystal silicon germanium layer of the second conductivity type and in said single crystal silicon germanium layer of the first conductivity type, respectively, decrease from the side of said single crystal silicon of the first conductivity type toward the surface, and the inclination of the compositional profile of germanium in said single crystal silicon germanium layer of the first conductivity type is larger than zero and smaller than that of germanium in said single crystal silicon germanium layer of the second conductivity type.

8. A bipolar transistor according to claim 1, wherein a compositional ratio of germanium in said single crystal silicon germanium layer of the second conductivity type decreases from the side of said single crystal silicon layer of the first conductivity type toward the surface, and a compositional ratio of germanium in said single crystal silicon germanium layer of the first conductivity type decreases from the surface toward the side of said single crystal silicon layer of the first conductivity type.

9. An optical reception system which comprises a photo detector for receiving an optical signal and outputting an electric signal, a first amplifier circuit for receiving the electric signal from said photo detector, a second amplifier circuit for receiving the output from said first amplifier circuit, and a decision circuit for converting the output from said second amplifier circuit into a digital signal in synchronism with a given clock signal, wherein said first amplifier circuit has a first bipolar transistor including a base connected to said photo detector, and a second bipolar transistor including a base connected to a collector of said first bipolar transistor and further including a collector-emitter path connected to an input of said second amplifier circuit, and wherein at least one of the first and second bipolar transistors comprises:

a multilayered film which includes a single crystal silicon layer of a first conductivity type, a first insulating layer formed on a surface of said single crystal silicon layer of the first conductivity type and having an opening therein, a polycrystalline layer of a second conductivity type opposite to the first conductivity type, and a second insulating layer;

a single crystal silicon germanium layer of the first conductivity type formed in the opening;

a single crystal silicon germanium layer of the second conductivity type formed on said single crystal silicon germanium layer of the first conductivity type;

a polysilicon germanium layer formed in contact with both said single crystal silicon germanium layer of the second conductivity type and said polycrystalline layer of the second conductivity type; and a second single crystal layer of the second conductivity type which is formed on said single crystal silicon germanium layer of the second conductivity type and is lower in impurity concentration than said single crystal silicon germanium layer of the second conductivity type.

10. An optical reception system according to claim 9, wherein the first and second bipolar transistors are formed on a single semiconductor chip, and said semiconductor chip and said photo detector are mounted on a single board.

11. An optical signal reception system, comprising:

a photo detector for receiving an optical signal and outputting an electric signal; and an amplifier circuit having a first bipolar transistor including a base connected to the photo detector for receiving the electric signal, and a second bipolar transistor including a base connected to a collector of the first bipolar transistor and further including a collector emitter path which provides an output of the amplifier, wherein at least one of the first and second bipolar transistors comprises:

a multilayered film including a single crystal silicon layer of a first conductivity type, a first insulating layer formed on a surface of said single crystal silicon layer of the first conductivity type and having an opening therein, a polycrystalline layer of a second conductivity type opposite to the first conductivity type, and a second insulating layer;

a single crystal silicon germanium layer of the first conductivity type formed in the opening;

a single crystal silicon germanium layer of the second conductivity type formed on the single crystal silicon germanium layer of the first conductivity type;

a polysilicon germanium layer formed in contact with both the single crystal germanium silicon layer of the second conductivity type and the polycrystalline layer of the second conductivity type; and a second single crystal layer of the second conductivity type which is formed on said single crystal silicon germanium layer of the second conductivity type and is lower in impurity concentration than said single crystal silicon germanium layer of the second conductivity type.

12. A system according to claim 11, wherein said polycrystalline layer of the second conductivity type is comprised of one of a polysilicon layer and a polysilicon germanium layer.

13. A system according to claim 11, wherein said single crystal silicon germanium layer of the first conductivity type has a thickness of at least 5 nm.

14. A system according to claim 11, wherein said second single crystal layer of the second conductivity type is comprised of one of a single crystal silicon layer and a single crystal silicon germanium layer.

15. A system according to claim 11, wherein said single crystal silicon germanium layer of the second conductivity type has a compositional ratio of germanium which decreases from a side of the single crystal silicon germanium layer of the second conductivity type facing said first single crystal silicon of the first conductivity type toward the surface.

16. A system according to claim 11, wherein compositional ratios of germanium in said single crystal silicon germanium layer of the second conductivity type and in said single silicon germanium layer of the first conductivity type, respectively, decrease from a side of the single crystal silicon germanium layer of the second conductivity type facing said single crystal silicon of the first conductivity type toward the surface.

17. A system according to claim 11, wherein compositional ratios of germanium in said single crystal silicon germanium layer of the second conductivity type and in said single silicon germanium layer of the first conductivity type, respectively, decrease from the sides thereof facing said single crystal silicon of the first conductivity type toward the surface, and the inclination of the compositional profile of germanium in said single crystal silicon germanium layer of the first conductivity type is larger than zero and smaller than that of germanium in said single crystal silicon germanium layer of the second conductivity type.

18. A system according to claim 11, wherein a compositional ratio of germanium in said single crystal silicon germanium layer of the second conductivity type decreases from a side thereof facing said single crystal silicon layer of the first conductivity type toward the surface, and wherein a compositional ratio of germanium in said single crystal silicon germanium layer of the first conductivity type decreases from the surface thereof toward a side facing said single crystal silicon layer of the first conductivity type.

* * * * *